US007911814B2

(12) United States Patent
Tao et al.

(10) Patent No.: US 7,911,814 B2
(45) Date of Patent: *Mar. 22, 2011

(54) CONSTANT CURRENT AND VOLTAGE CONTROLLER IN A THREE-PIN PACKAGE WITH DUAL-USE POWER PIN

(75) Inventors: Zhibo Tao, San Jose, CA (US); David Kunst, Cupertino, CA (US); Steven Huynh, Sunnyvale, CA (US)

(73) Assignee: Active-Semi, Inc. (VG)

( * ) Notice: Subject to any disclaimer, the term of this patent is extended or adjusted under 35 U.S.C. 154(b) by 286 days.

This patent is subject to a terminal disclaimer.

(21) Appl. No.: 12/156,379

(22) Filed: May 30, 2008

(65) Prior Publication Data

US 2009/0295348 A1 Dec. 3, 2009

(51) Int. Cl.
*H02M 3/335* (2006.01)
(52) U.S. Cl. .................... 363/21.12; 363/21.18
(58) Field of Classification Search ........... 363/21.12, 363/21.18, 97, 147
See application file for complete search history.

(56) References Cited

U.S. PATENT DOCUMENTS

| 5,313,381 | A | * | 5/1994 | Balakrishnan | 363/147 |
| 6,434,021 | B1 | * | 8/2002 | Collmeyer et al. | 363/21.01 |
| 6,958,920 | B2 | * | 10/2005 | Mednik et al. | 363/19 |
| 2008/0259656 | A1 | * | 10/2008 | Grant | 363/21.18 |
| 2009/0279332 | A1 | * | 11/2009 | Grant et al. | 363/84 |
| 2009/0295349 | A1 | * | 12/2009 | Tao et al. | 323/282 |

* cited by examiner

*Primary Examiner* — Adolf Berhane
*Assistant Examiner* — Emily Pham
(74) *Attorney, Agent, or Firm* — Imperium Patent Works; Darien K. Wallace

(57) ABSTRACT

A flyback converter includes a controller integrated circuit (IC) housed in an IC package with only three terminals. An inexpensive TO-92 transistor package can be used. A switch terminal is coupled to an inductor switch that is turned on by a switch control signal having a frequency and a pulse width. The inductor switch controls the current that flows through a primary inductor of the flyback converter. The controller IC adjusts the frequency in a constant current mode such that output current remains constant and adjusts the pulse width in a constant voltage mode such that output voltage remains constant. A power terminal receives a feedback signal that is derived from a voltage across an auxiliary inductor of the flyback converter. The feedback signal provides power to the controller IC and is also used to generate the switch control signal. The controller IC is grounded through a ground terminal.

22 Claims, 14 Drawing Sheets

ADJUSTING FREQUENCY TO CONTROL
OUTPUT CURRENT AND ADJUSTING PULSE
WIDTH TO CONTROL OUTPUT VOLTAGE

US 7,911,814 B2

CONSTANT CURRENT AND VOLTAGE CONTROLLER IN A THREE-PIN PACKAGE WITH DUAL-USE POWER PIN

TECHNICAL FIELD

The present invention relates generally to the field of power conversion and, more particularly, to a switch mode power supply circuit that regulates output current and output voltage using only three pins.

BACKGROUND

Various integrated circuit chips are currently used to control flyback converters that supply constant current and constant voltage. FIG. 1 (prior art) illustrates an exemplary prior art constant output current flyback converter 10 controlled on the primary side of a transformer 11. Although flyback converter 10 avoids the cost of an opto-coupler typically used in secondary-side controlled converters, flyback converter 10 requires a relatively expensive integrated circuit package. Flyback converter 10 includes an integrated circuit package with six pins to accommodate a conventional peak-current-mode pulse width modulation (PWM) controller integrated circuit (IC) 12. Typically, IC packages with more pins are more expensive than IC packages with fewer pins.

In addition, the discrete external components of flyback converter 10 also contribute to the manufacturing cost. The external components include transformer 11, a voltage divider resistor network 13, a primary switch 14, a primary-side rectifier 15, a secondary-side rectifier 16 and other resistors and capacitors. Transformer 11 has three windings: a primary-side winding Lp, a secondary-side winding Ls, and an auxiliary winding La. Primary switch 14 is an external metal-oxide semiconductor field-effect transistor (MOSFET). A resistor 17 on the secondary side in FIG. 1 represents the resistive loss of the copper windings of transformer 11. Flyback converter 10 also includes a current sense resistor 18, an output capacitor 19, a start-up resistor 20 and a power capacitor 21. The initial start-up energy for controller IC 12 is provided by resistor 20 and capacitor 21. Once flyback converter 10 is stable, auxiliary winding La of transformer 11 powers IC 12 via primary-side rectifier 15.

FIG. 2 (prior art) illustrates another constant output current flyback converter 22 controlled on the primary side of transformer 11. Flyback converter 22 includes a controller IC 23 that is contained in a four-pin integrated circuit package. The IC package of flyback converter 22 is less expensive than the IC package of flyback converter 10 because controller IC 23 requires four as opposed to six pins. Flyback converter 22 still includes voltage divider resistor network 13. Controller IC 23 receives a feedback signal 24 from auxiliary winding La via a voltage divider resistor network 13 and uses feedback signal 24 to control an external NPN bipolar transistor 25. For additional details on a constant output current flyback converter that can be packaged in a four-pin IC package, see U.S. patent application Ser. No. 11/888,599 entitled "Constant Current and Voltage Controller in a Four-Pin Package with Dual-Use Pin," filed on Jul. 31, 2007, which is incorporated herein by reference.

A less expensive flyback converter is sought that has fewer external components and that is controlled by a controller IC that is contained in an IC package with fewer pins.

SUMMARY

A flyback converter includes a controller integrated circuit (IC) housed in an IC package with only three terminals: a ground terminal, a power terminal and a switch terminal. The power terminal is used for multiple functions. The controller IC is grounded through the ground terminal. The switch terminal is coupled to an inductor switch that is turned on by an inductor switch control signal having a frequency and a pulse width. The inductor switch controls the current that flows through a primary inductor of the flyback converter. The power terminal receives a feedback signal that is derived from a voltage across an auxiliary inductor of the flyback converter. The feedback signal provides power to the controller IC and is also used to generate the inductor switch control signal. The controller IC adjusts the frequency of the inductor switch control signal in a constant current mode such that the output current of the flyback converter remains constant. In a constant voltage mode, the controller IC adjusts the pulse width of the inductor switch control signal such that the output voltage remains constant.

The switch terminal receives a switch signal that is indicative of the inductor current flowing through the primary inductor. Controller IC controls the pulse width of inductor switch control signal such that the time at which the inductor current stops increasing through the primary inductor corresponds to the time at which the switch signal reaches a peak current limit. Controlling the pulse width prevents the output current from exceeding a predetermined current limit.

The controller IC has a power bond pad, a switch bond pad and a ground bond pad. The power bond pad is coupled to the power terminal; the switch bond pad is coupled to the switch terminal; and the ground bond pad is coupled to the ground terminal. In one embodiment, the controller IC has no bond pads other than the power bond pad, the switch bond pad and the ground bond pad.

A method of operating a power converter includes a step of magnetically coupling an auxiliary inductor to a primary inductor and to a secondary inductor of the power converter. The power converter has an external inductor switch and a controller IC. The controller IC has an internal inductor switch that is coupled to the external inductor switch. The internal inductor switch is turned on and off by an inductor switch control signal. The inductor switch control signal has a frequency and a pulse width.

In another step, a feedback signal is derived from a voltage across the auxiliary inductor and is received onto a power bond pad of the controller IC. In addition to the power bond pad, the controller IC has a switch bond pad and ground bond pad. The controller IC is contained in an IC package that has a power terminal, a switch terminal and a ground terminal. The IC package includes no terminals other than the power terminal, the ground terminal and the switch terminal. The power terminal is coupled to the power bond pad; the switch terminal is coupled to the switch bond pad; and the ground terminal is coupled to the ground bond pad.

In another step, the inductor switch control signal is generated using the feedback signal.

In another step, the internal inductor switch is turned on and off using the inductor switch control signal.

In another step, the frequency of the inductor switch control signal is adjusted using the feedback signal such that the output current of the power converter remains constant. Information conveyed in the feedback signal while the internal inductor switch is turned off is used to adjust the frequency such that the output current remains constant.

In another step, the pulse width of the inductor switch control signal is adjusted using the feedback signal such that the output voltage of the power converter remains constant. Information conveyed in the feedback signal while the internal inductor switch is turned off is used to adjust the pulse width such that the output voltage remains constant.

In another embodiment, a power converter includes a primary inductor and a secondary inductor that are magnetically coupled to an auxiliary inductor. A feedback signal is derived from a voltage across the auxiliary inductor. The power converter also includes a controller IC with a switch bond pad that is coupled to an inductor switch of the controller IC. The inductor switch is turned on and off by an inductor switch control signal. The power converter also includes a means for receiving the feedback signal. The feedback signal is used both to power the controller IC and to generate the inductor switch control signal. The controller IC uses the feedback signal to adjust the frequency of the inductor switch control signal such that the output current of the power converter remains constant. The controller IC also uses the feedback signal to adjust the pulse width of the inductor switch control signal such that the output voltage of the flyback converter remains constant. The controller IC is packaged in an IC package that includes no more than three terminals.

In another embodiment, a flyback converter includes a controller IC housed in an IC package with only three terminals: a ground terminal, a power terminal and a switch terminal. The switch terminal is used for multiple functions. The controller IC is grounded through the ground terminal. An auxiliary voltage signal is received onto the power terminal and provides power to the controller IC. The auxiliary voltage signal is derived from a voltage across a first auxiliary inductor of the flyback converter. The switch terminal is coupled to an inductor switch that is turned on and off by an inductor switch control signal having a frequency and a pulse width. The inductor switch controls the current that flows through a primary inductor of the flyback converter. The inductor switch is coupled through an external transistor to the primary inductor. A switch signal is received onto the switch terminal and is used to generate the inductor switch control signal. The switch signal provides information that allows the flyback converter to output a constant current during a constant current mode, to output a constant voltage during a constant voltage mode and to prevent the output current from exceeding a predetermined current limit. Information conveyed in the switch signal provides an indication both of the output voltage of the flyback converter and of when the current has stopped increasing in magnitude through the primary inductor.

The controller IC uses the information from the switch signal to generate the inductor switch control signal in both the constant current mode and in the constant voltage mode. The controller IC adjusts the frequency of the inductor switch control signal in the constant current mode such that the output current remains constant and adjusts the pulse width of the inductor switch control signal in the constant voltage mode such that the output voltage remains constant. The controller IC also uses the information from the switch signal to control the peak current that flows through the primary inductor such that the output current of the flyback converter does not exceed the predetermined current limit.

In another embodiment, a power converter has a controller IC, a primary inductor, a secondary inductor, a first auxiliary inductor and a second auxiliary inductor. The auxiliary inductors are magnetically coupled to the primary and secondary inductors. The controller IC has an inductor switch, a power bond pad, a switch bond pad and a ground bond pad. The controller IC receives power through the power bond pad and is grounded through the ground bond pad. The inductor switch is coupled to the switch bond pad and is turned on and off by an inductor switch control signal. The switch bond pad receives a switch signal that is used by the controller IC to generate the inductor switch control signal. The controller IC uses the switch signal to adjust the frequency of the inductor switch control signal in a constant current mode such that the output current of the power converter remains constant. The controller IC also uses the switch signal to adjust the pulse width of the inductor switch control signal in a constant voltage mode such that the output voltage of the power converter remains constant. The controller IC also uses the switch signal to adjust the pulse width of the inductor switch control signal such that the output current of the flyback converter does not exceed a predetermined current limit.

A method of operating a power converter includes a step of magnetically coupling an auxiliary inductor to a primary inductor and to a secondary inductor of the power converter. The power converter has an external inductor switch and a controller IC. The controller IC has an internal inductor switch that is coupled to the external inductor switch. The internal inductor switch is turned on and off by an inductor switch control signal. The inductor switch control signal has a frequency and a pulse width.

In another step, a switch signal is received onto a switch bond pad of the controller integrated circuit. The switch signal is derived from a voltage across the auxiliary inductor.

In another step, the inductor switch control signal is generated using the switch signal.

In another step, the internal inductor switch is turned on and off using the inductor switch control signal.

In another step, the frequency of the inductor switch control signal is adjusted using the switch signal such that the output current of the power converter remains constant. Information conveyed in the switch signal while the internal inductor switch is turned off is used to adjust the frequency such that the output current remains constant.

In another step, the pulse width of the inductor switch control signal is adjusted using the switch signal such that the output voltage of the power converter remains constant. Information conveyed in the switch signal while the internal inductor switch is turned off is used to adjust the pulse width such that the output voltage remains constant.

In another embodiment, a power converter includes a primary inductor that is magnetically coupled to a first auxiliary inductor and to a second auxiliary inductor. An auxiliary voltage signal is derived from a voltage across the first auxiliary inductor. The power converter also includes a controller IC with a switch bond pad that is coupled to an inductor switch of the controller IC. The inductor switch is turned on and off by an inductor switch control signal. The power converter also includes a means for receiving a switch signal that is derived from a voltage across the second auxiliary inductor and from the current flowing through the primary inductor. The switch signal is used both to adjust the frequency of the inductor switch control signal such that the output current of the power converter remains constant and to adjust the pulse width of the inductor switch control signal such that the output voltage of the flyback converter remains constant. In addition, the switch signal is used to adjust the pulse width of the inductor switch control signal such that the output current of the flyback converter does not exceed a predetermined current limit. The controller IC is packaged in an IC package that includes no more than three terminals.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 3:
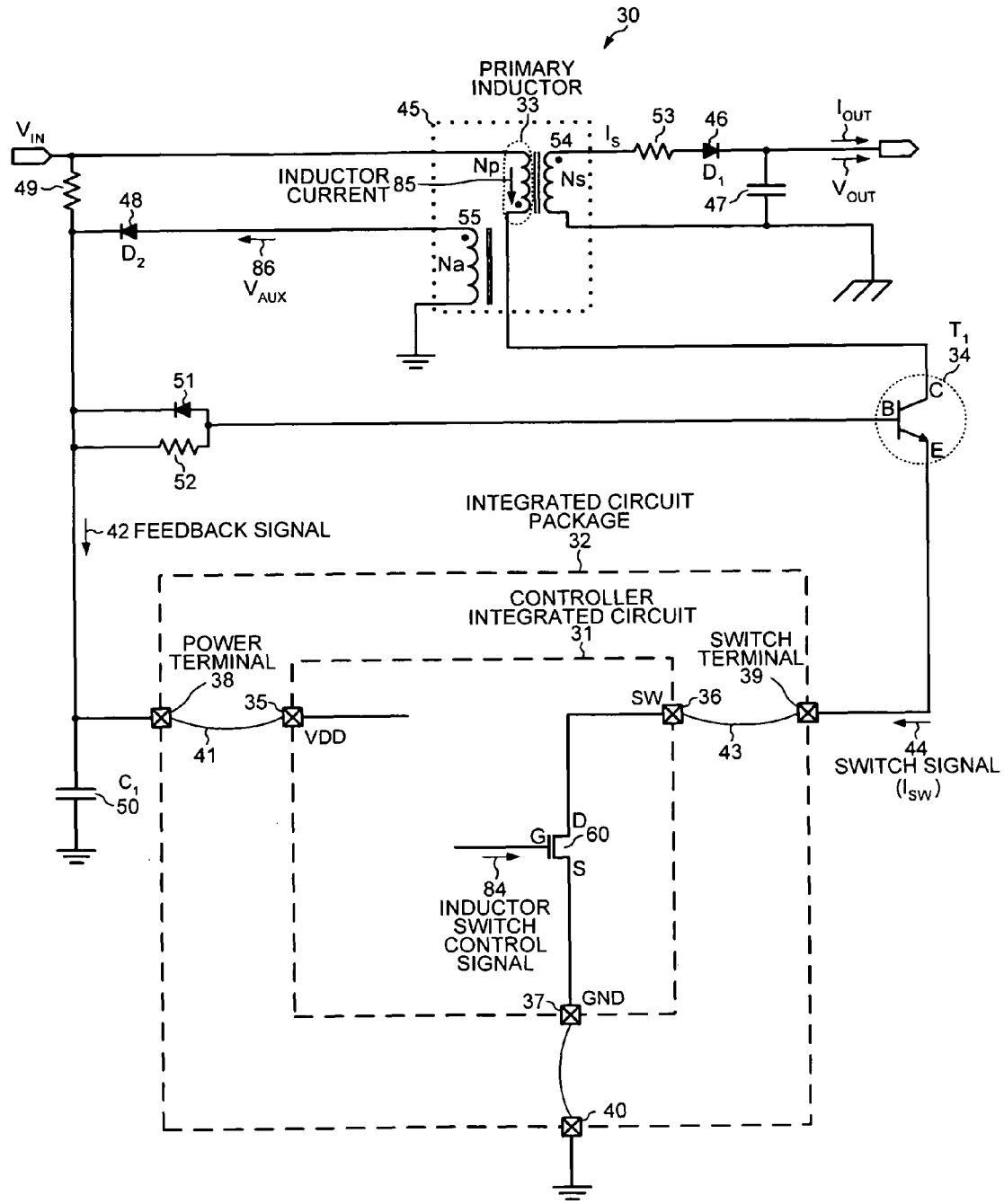
FIG. 3 is a simplified schematic diagram of a primary-side controlled flyback converter with a controller integrated circuit (IC) housed in an integrated circuit package with only three pins in accordance with a first embodiment of the invention.

FIG. 3 is a diagram of a flyback converter 30 with a controller integrated circuit (IC) 31 packaged in an integrated circuit package 32. Although the term "integrated circuit" is commonly used to denote both an integrated circuit and the integrated circuit package in which the integrated circuit is housed, the term "integrated circuit" as used herein denotes only the integrated circuit die. Flyback converter 30 includes a transformer that converts an input voltage into a different output voltage. In one embodiment, the input voltage is the voltage from a wall outlet, and the output voltage is used to charge a portable electronic consumer device. When a main power switch in the converter is turned on, a current starts flowing through a primary inductor of the transformer. After current ramps up through the primary inductor to a peak magnitude and is then cut, a collapsing magnetic field around the primary inductor transfers energy to a secondary inductor. The energy transferred to the secondary inductor is output from flyback converter 30 as the output current with the different output voltage. In some applications, such as charging an electronic consumer device, it is desirable for the output current to be maintained at a constant level as well as prevented from exceeding a predetermined current limit.

Controller IC 31 controls the output voltage ($V_{OUT}$) and the output current ($I_{OUT}$) of flyback converter 30 by adjusting the peak current that flows through a primary inductor 33. The peak current is adjusted using pulse width modulation (PWM). Controller IC 31 also controls the output current ($I_{OUT}$) of flyback converter 30 by adjusting the peak current in the primary inductor and by adjusting the frequency at which an external NPN bipolar transistor 34 is turned on and off. Transistor 34 acts as the inductor switch for primary inductor 33. Controller IC 31 has a power bond pad 35, a switch bond pad 36 and a ground bond pad 37.

Figure 1:
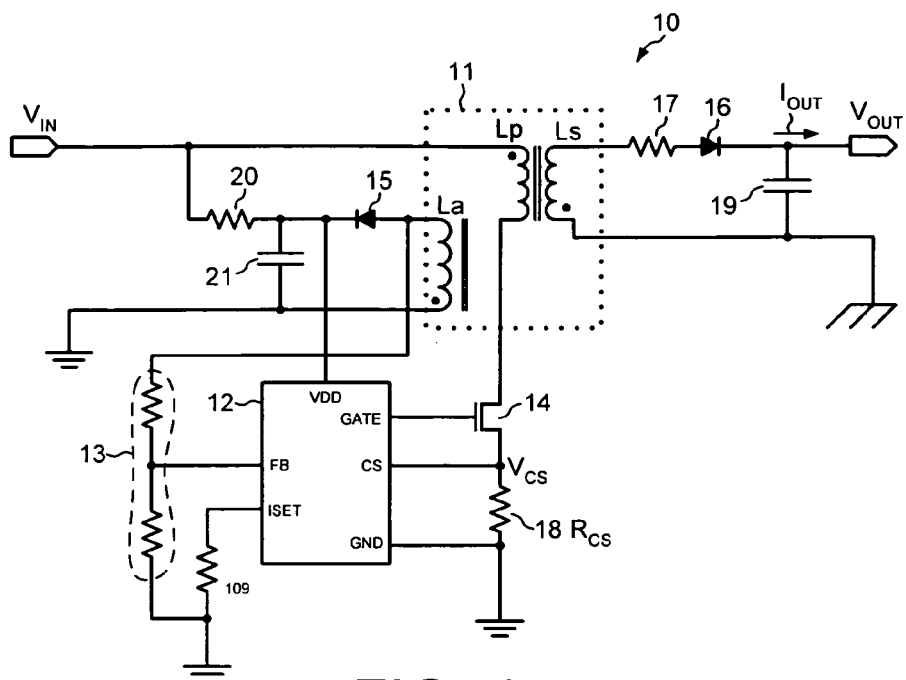
FIG. 1 (prior art) is a simplified schematic diagram of a constant output current flyback converter that is controlled on the primary side by a controller integrated circuit with six pins.
Figure 2:
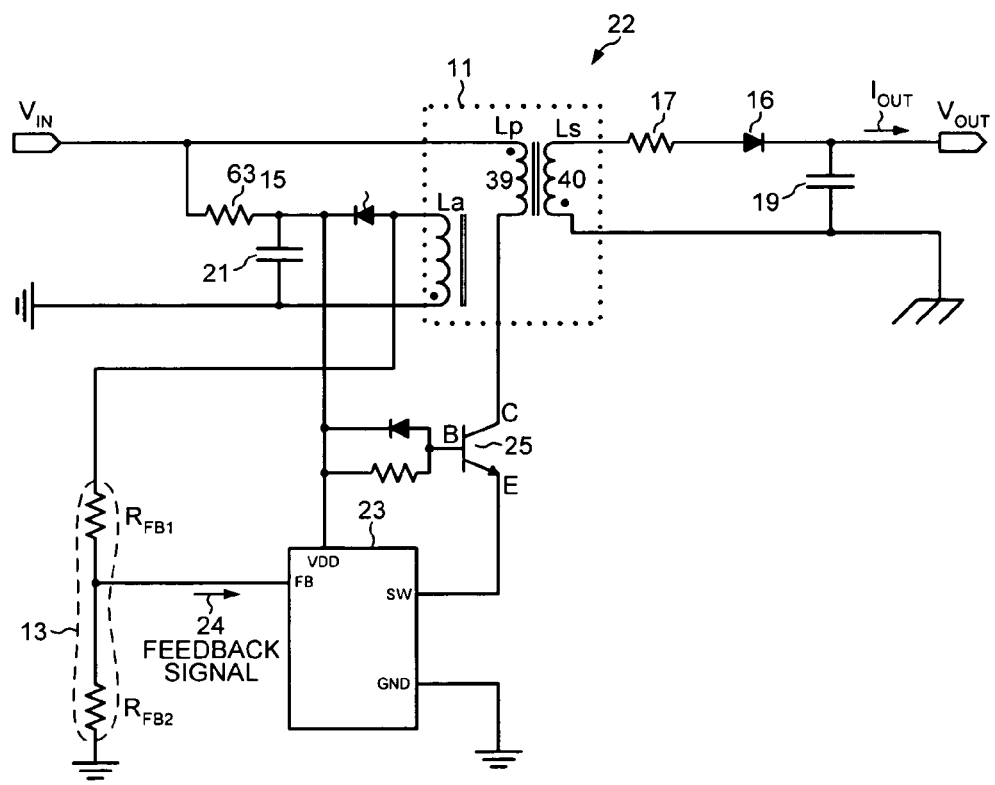
FIG. 2 (prior art) is a simplified schematic diagram of a constant output current flyback converter that is controlled on the primary side by a controller integrated circuit with four pins.

Because current is conveyed to controller IC 31 via only three bond pads, integrated circuit package 32 has only three terminals. Each terminal of an integrated circuit package adds cost. Thus, it is less expensive to produce controller IC 31 packaged in integrated circuit package 32 than it is to produce controller ICs requiring packages with more than three terminals. Integrated circuit package 32 has only three terminals: a power terminal 38, a switch terminal 39, and a ground terminal 40. Powering controller IC 31 by using a feedback signal that contains information indicative of the output voltage $V_{OUT}$ and output current ($I_{OUT}$) when inductor switch 34 is off avoids the need for separate terminals for (i) powering controller IC 31, (ii) providing feedback to control the output current of flyback converter 30, and (iii) providing feedback to control the output voltage of flyback converter 30. The four terminals used by flyback converter 22 of FIG. 2 can thereby be reduced to the three terminals of flyback converter 30.

In the embodiment of FIG. 3, power bond pad 35 is connected to power terminal 38 by a bond wire 41. Controller IC 31 receives an indication of the output voltage $V_{OUT}$ via power terminal 38. A feedback signal 42 is received onto power terminal 38 and then travels over bond wire 41 to power bond pad 35. Depending on the type of package, power terminal 38 can be a lead of a low-cost TO-92 3-pin package or the lead of a small outline transistor (SOT) package. The embodiment in which integrated circuit package 32 is a 3-pin TO-92 package allows controller IC 31 to be contained in a low-cost package that is typically used to house a single transistor. In the embodiment of FIG. 3, switch terminal 39 is connected to bond pad SW 36 by a bond wire 43. A switch signal 44 is received onto switch terminal 39 and then travels over bond wire 43 to bond pad SW 36.

In addition to controller IC 31, IC package 32 and inductor switch 34, flyback converter 30 also includes a transformer 45, a secondary-side rectifier 46, an output capacitor 47, a primary-side rectifier 48, a start-up resistor 49, a power capacitor ($C_1$) 50, and a diode 51 and resistor 52 that are coupled to the base of NPN bipolar transistor 34. Flyback converter 30 has no secondary side control circuit and no optical coupler. A secondary side resistor 53 shown in FIG. 3 represents the resistive loss of the copper windings of transformer 45. Transformer 45 includes primary winding (inductor) 33, a secondary winding 54 and an auxiliary winding 55. Primary winding 33 of transformer 45 has Np turns; secondary winding 54 has Ns turns; and auxiliary winding 55 has Na turns. The initial start-up energy for controller IC 31 is provided by start-up resistor 49 and power capacitor ($C_1$) 50. Once flyback converter 30 is stable, auxiliary winding 55 of transformer 45 powers controller IC 31 via rectifier 48.

The embodiment of flyback converter 30 shown in FIG. 3 is used in applications requiring higher input voltage or higher power and uses external power-handling components, such as NPN bipolar transistor 34. Other embodiments of flyback converter 30 that are used in lower input voltage or lower power applications have no external bipolar transistor, MOSFET power switch or current sense circuit, all of which can be integrated into the integrated circuit 31. In the embodiment of FIG. 3, NPN bipolar transistor 34 cooperates with controller IC 31 in an emitter switching configuration. External NPN bipolar transistor 34 acts as a switch to primary winding 33. In this configuration, an internal circuit in controller IC 31 drives the emitter of external bipolar transistor 34. In other embodiments, to further increase the power handling capability and switching frequency, an external MOSFET is used as the main switch instead of bipolar transistor 34. Generally, the frequency capability of bipolar transistor 34 is limited by the NPN base charge/discharge time, and the high power capability of bipolar transistor 34 is limited by the base drive resistor. Thus, using bipolar transistor 34 is appropriate for applications that do not require very high power or switching frequency.

Figure 4:
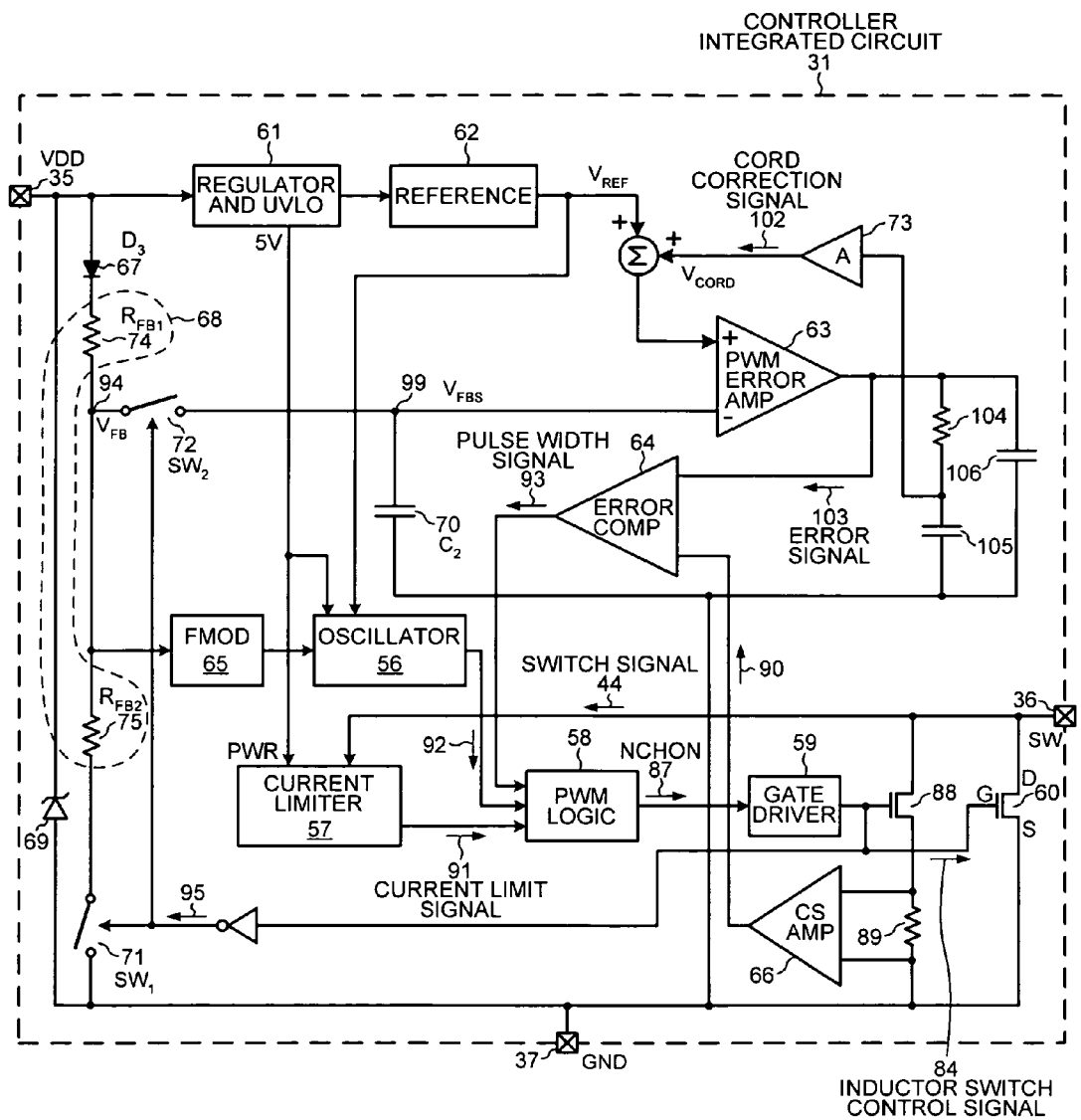
FIG. 4 is a more detailed schematic diagram of the controller IC of FIG. 3.

FIG. 4 is a more detailed schematic diagram of controller IC 31. Controller IC 31 includes an oscillator 56, a current limiter 57, pulse-width-modulation (PWM) logic 58, a gate driver 59 and an internal main power switch 60. In addition, controller IC 31 includes a regulator and under-voltage lockout circuit (UVLO) 61, a reference voltage generator 62, a PWM error amplifier 63, an error comparator 64, a frequency modulator (FMOD) 65, a current sense amplifier 66, a compensating diode 67, a voltage divider 68, a power voltage clamp 69, a sampler capacitor ($C_2$) 70, a first switch ($SW_1$) 71, a second switch ($SW_2$) 72, and a cord correction circuit 73.

The only feedback from the secondary side of transformer 45 used by flyback converter 30 to control the output current and voltage is feedback from the magnetic coupling of auxiliary winding 55 and secondary winding 54. The cost of flyback converter 30 is reduced by not using a secondary side control circuit or an optical coupler. In addition, the cost of 3-pin IC package 32 is less than the cost of a 4-pin package. For example, a low-cost TO-92 3-pin package typically used to house transistors can be used to package controller IC 31. Finally, the cost is reduced by reducing external components by placing voltage divider 68 inside controller IC 31. The manufacturing cost of first feedback resistor ($R_{FB1}$) 74 and second feedback resistor ($R_{FB2}$) 75 of internal voltage divider 68 is less than the cost of the external voltage divider resistor network 13 of flyback converter 22. In a typical application, flyback converter 30 generates an output voltage ($V_{OUT}$) of about five volts. The resistors of voltage divider 68 are sized to accommodate the 5-volt output voltage. The resistance of voltage divider 68 is adjusted when an application requires an output voltage ($V_{OUT}$) other than five volts. For example, in order to accommodate a 12-volt output voltage, fuses or anti-fuses or EPROM, EEPROM or other non-volatile programming means inside controller IC 31 are programmed so as to adjust the voltage ratio of voltage divider 68. Using fuses, anti-fuses or other non-volatile programming means to alter the resistance of voltage divider 68 allows controller IC 31 to be one-time-programmable (OTP).

Figure 5:
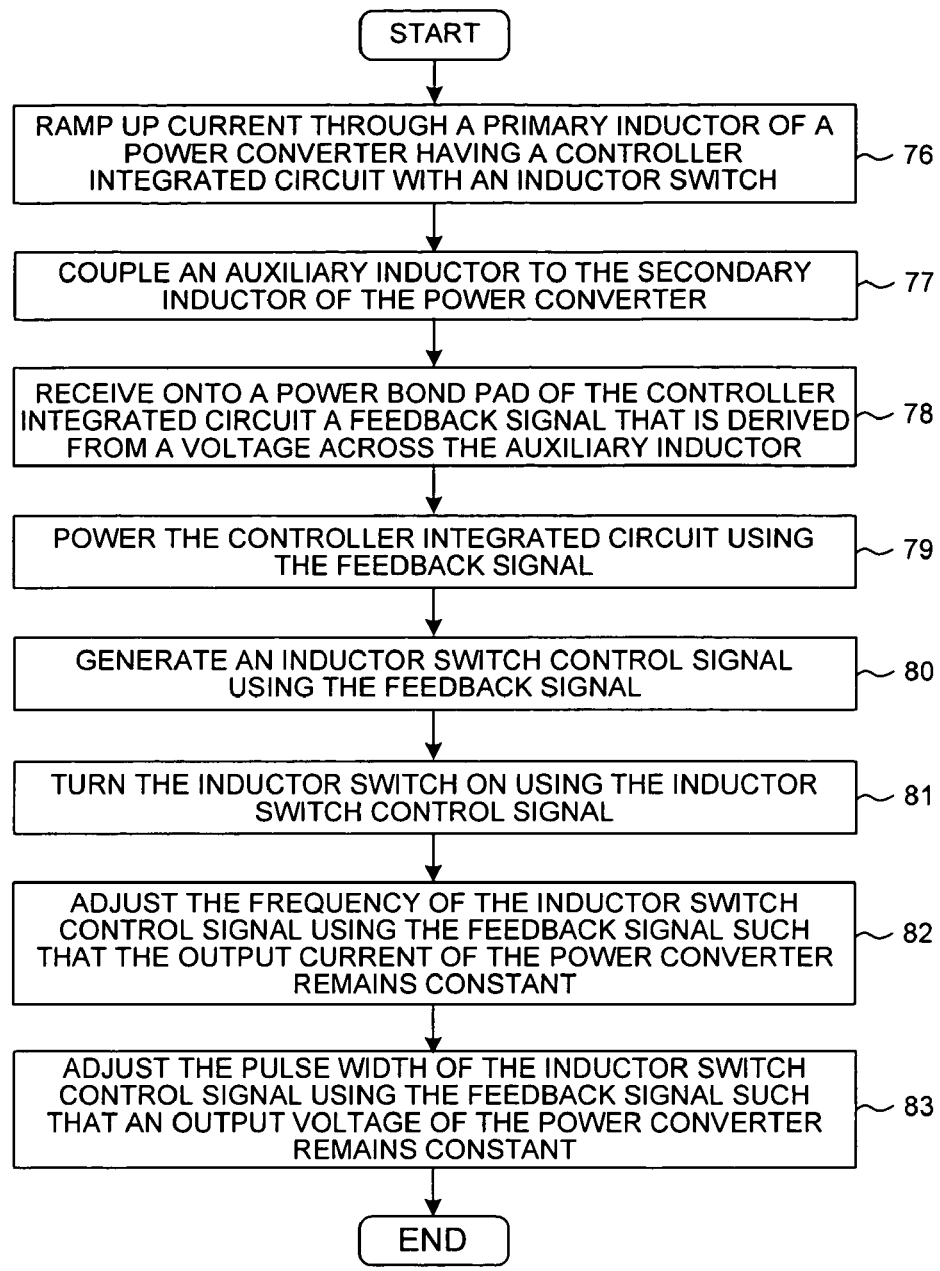
FIG. 5 is a flowchart of a method for controlling the output current and voltage of the flyback converter of FIG. 3.

FIG. 5 is a flowchart illustrating steps 76-83 of a method of operation of the flyback converter 30 of FIG. 3. The method controls the output current ($I_{OUT}$) of flyback converter 30 by adjusting the frequency of an inductor switch control signal 84 that turns main power switch 60 on and off and indirectly inductor switch 34 on and off. The method also controls the output voltage ($V_{OUT}$) of flyback converter 30 by adjusting the pulse width of inductor switch control signal 84 and thereby the peak current that flows through primary inductor 33 of flyback converter 30. In some applications, it is desirable for the output current ($I_{OUT}$) of flyback converter 30 to be maintained at a constant level. The output current ($I_{OUT}$) is dependent on at least three factors: (i) the peak magnitude of an inductor current 85 through primary inductor 33, (ii) the inductance ($L_P$) of primary inductor 33, and (iii) the frequency ($f_{OSC}$) at which main power switch 60 is turned on and off by inductor switch control signal 84 allowing current to ramp up through primary inductor 33.

The method of FIG. 5 adjusts the frequency ($f_{OSC}$) at which main power switch 60 turns on and off in order to maintain constant output current ($I_{OUT}$) from flyback converter 30. Thus, output current ($I_{OUT}$) is maintained at a constant magnitude by adjusting either or both the switching frequency ($f_{OSC}$) at which inductor current 85 ramps up through primary inductor 33 or the peak amount of current ($I_P$) flowing through primary inductor 33.

In a first step 76 shown in FIG. 5, flyback converter 30 is connected to an input voltage ($V_{IN}$), and main power switch 60 is turned on. Then, inductor current 85 starts flowing through primary inductor 33. When main power switch 60 is on, the voltage at the dot end of primary inductor 33 goes low, and the voltage at the not-dot end is high. As inductor current 85 ramps up through primary inductor 33, the input energy is stored in primary inductor 33. Then, the energy is transferred to secondary winding 54 when main power switch 60 is turned off. The energy transferred to secondary winding 54 is output from flyback converter 30 as the output current ($I_{OUT}$).

In a step 77, auxiliary winding 55 is magnetically coupled to secondary winding 54. As inductor current 85 ramps up through primary inductor 33 and then stops flowing, energy is also transferred to auxiliary winding 55 and generates a voltage ($V_{AUX}$) 86 on the dot end of auxiliary winding 55. Voltage ($V_{AUX}$) 86 contains information relating to the output voltage when main power switch 60 is off.

In a step 78, feedback signal 42 is received onto power bond pad (VDD) 35 of controller IC 31. Feedback signal 42 is derived from the voltage ($V_{AUX}$) 86 across auxiliary inductor 55 when auxiliary inductor 55 magnetically couples with primary winding 33 and secondary winding 54.

In a step 79, feedback signal 42 is used to power controller IC 31. Regulator and under-voltage lockout circuit (UVLO) 61 receives feedback signal 42 from power bond pad (VDD) 35 and provides an internal power supply to controller IC 31. In the event that the voltage ($V_{DD}$) present on power bond pad (VDD) 35 exceeds a safe operating range, power voltage clamp 69 acts as a protection device and dumps the excess charge. In one embodiment, regulator 61 uses feedback signal 42 to generate a 5-volt signal that powers the circuitry of controller IC 31, such as current limiter 57.

In steady state operation, regulator 61 receives a fifteen-volt voltage from feedback signal 42 onto power bond pad (VDD) 35. During start up and before any voltage is generated by auxiliary winding 55, a voltage that is produced by start-up resistor 49 and power capacitor ($C_1$) 50 is received onto power bond pad (VDD) 35. The voltage on power capacitor ($C_1$) 50 builds up during startup until the under-voltage lockout turn-on threshold of nineteen volts is reached and controller IC 31 begins switching main power switch 60. Regulator and under-voltage lockout circuit (UVLO) 61 monitors the $V_{DD}$ voltage received as feedback signal 42 and enables the normal operation of controller IC 31 when $V_{DD}$ reaches the under-voltage lockout turn-on threshold. In this example, the under-voltage lockout turn-off threshold is eight volts. If $V_{DD}$ drops to or below the turn-off threshold, then regulator and under-voltage lockout circuit (UVLO) 61 stops the switching of controller IC 31, and charge flows through start-up resistor 49 onto power capacitor ($C_1$) 50 until the under-voltage lockout turn-on threshold of nineteen volts is again reached.

In a step 80, controller IC 31 uses feedback signal 42 to generate inductor switch control signal 84. Controller IC 31 also uses switch signal ($I_{SW}$) 44 to generate inductor switch control signal 84. Controller IC 31 receives feedback signal 42 from primary-side rectifier ($D_2$) 48 through power terminal 38 and power bond pad (VDD) 35. Current limiter 57 of controller IC 31 receives switch signal ($I_{SW}$) 44 from switch bond pad 36 indicating the magnitude of inductor current 85 flowing through primary inductor 33. Current limiter 57 turns off main power switch 60 when a predetermined peak current limit is reached. Switch signal 44 is obtained from the emitter of external NPN bipolar transistor 34 via switch terminal (SW) 39 of IC package 32. Inductor current 85, which ramps up through primary inductor 33, flows through NPN bipolar transistor 34, switch terminal 39 and switch bond pad 36.

In a step 81, inductor switch control signal 84 is asserted, which closes main power switch 60 and turns on inductor switch 34. Then inductor current 85 begins ramping up through primary inductor 33. Inductor switch control signal 84 has a frequency ($f_{OSC}$) and a pulse width and controls the gate of main power switch 60 through which inductor current 85 flows. Gate driver 59 generates inductor switch control signal 84 using an "N-channel on" (NCHON) signal 87. Gate driver 59 is a relatively high-speed MOSFET gate driver. The inductor switch control signal 84 is received by a smaller scaled internal MOSFET 88 in addition to main power switch 60. The smaller internal MOSFET 88 and a resistor 89 form a current sense circuit. The sensed current is amplified by current sense amplifier 66 and is converted to a voltage signal 90. Voltage signal 90 is compared by error comparator 64 to the output of PWM error amplifier 63.

PWM logic 58 generates the N-channel on signal 87 using a current limit signal 91 from current limiter 57, a switching frequency signal 92 from oscillator 56 and a pulse width signal 93 from error comparator 64. Switching frequency signal 92 provides the frequency of the pulses of inductor switch control signal 84, and pulse width signal 93 provides the duration of the pulse width of inductor switch control signal 84. Current limiter 57 generates current limit signal 91 using switch signal ($I_{SW}$) 44 and an internally generated fixed reference voltage.

In addition to limiting peak input current, flyback converter 30 also outputs constant current and constant voltage by operating in two modes: a constant current mode and a constant voltage mode. In constant current mode, current limiter 57 controls the pulse width of inductor switch control signal 84 such that the time ($T_2$) at which inductor current 85 stops increasing through primary inductor 33 corresponds to the time at which switch signal ($I_{SW}$) 44 reaches a peak current limit.

In a step 82, flyback converter 30 adjusts the frequency ($f_{OSC}$) of inductor switch control signal 84 using information from feedback signal 42 when inductor switch 34 is turned off such that the output current ($I_{OUT}$) remains constant. In the constant current mode, the peak ($I_P$) of the inductor current 85 always reaches its limit, and the output current ($I_{OUT}$) is adjusted by regulating the frequency at which pulses of peak current ramp up through primary inductor 33. Switching frequency signal 92 output by oscillator 56 controls the frequency ($f_{OSC}$) of inductor switch control signal 84 such that the output current ($I_{OUT}$) remains constant as output voltage ($V_{OUT}$) received by the device being charged increases.

In a step 83, flyback converter 30 adjusts the pulse width of inductor switch control signal 84 using information from feedback signal 42 when inductor switch 34 is turned off such that the output voltage ($V_{OUT}$) remains constant. Flyback converter 30 enters the constant voltage mode when the load current can be satisfied with a primary-side peak current that is less than the predetermined peak current limit. In the constant voltage mode when inductor current 85 is below the peak current limit, pulse width signal 93 output by error comparator 64 controls the pulse width of inductor switch control signal 84 such that the peak of each pulse of inductor current 85 maintains a constant output voltage ($V_{OUT}$).

Figure 6:
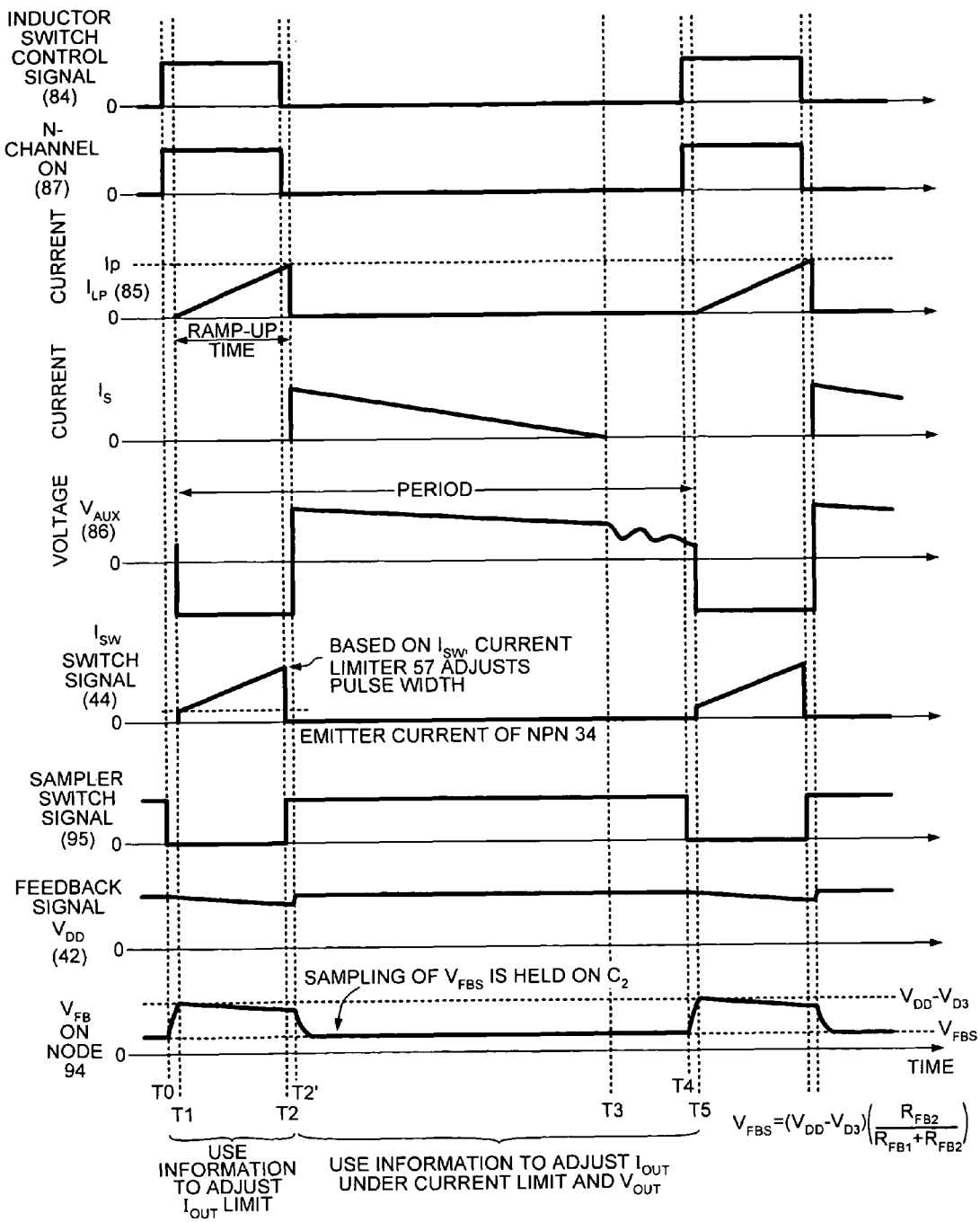
FIG. 6 is a diagram showing idealized waveforms that illustrate the operation of the flyback converter of FIG. 3 while performing the method of FIG. 5.

FIG. 6 shows idealized waveforms on various nodes of flyback converter 30. The waveforms illustrate the operation of flyback converter 30 during the method of FIG. 5. Main power switch 60 turns on at $T_0$, turns off at $T_2$, and turns on again at $T_4$. The time between $T_0$ and $T_1$ represents the delay from when main power switch 60 is turned on and when inductor switch 34 turns on allowing inductor current 85 ($I_{LP}$) to begin to ramp up. Thus, the time between $T_1$ and $T_5$ is the switching period. Inductor switch 34 also exhibits a turn-off delay from time $T_2$ to time $T_2'$. The time between $T_1$ and $T_2'$ is the ramp-up time. The time between $T_2'$ and $T_4$ is the time during which main power switch 60 is turned off. FIG. 6 illustrates that the information received from feedback signal 42 while main power switch 60 is turned off is used to regulate both the output current ($I_{OUT}$) and the output voltage ($V_{OUT}$). In constant current mode, current limiter 57 controls the pulse width of inductor switch control signal 84 such that the time $T_2'$ at which inductor current 85 stops increasing through primary inductor 33 corresponds to the time at which switch signal ($I_{SW}$) 44 reaches the preset peak current limit.

The current waveform $I_S$ shows that the current through secondary winding 54 discharges to zero by the time $T_3$. FIG. 6 illustrates that flyback converter 30 operates in a discontinuous conduction mode (DCM) because there is a gap between time $T_3$ at which current $I_S$ stops flowing through secondary winding 54 and the time $T_5$ at which inductor current ($I_{LP}$) 85 next begins ramping up through primary inductor 33.

Feedback signal 42 provides an indication of the output voltage ($V_{OUT}$) of secondary winding 54. The indication of the output voltage ($V_{OUT}$) is used to adjust both the output voltage ($V_{OUT}$) and the output current ($I_{OUT}$). As shown in FIG. 3, power bond pad (VDD) 35 of controller IC 31 on the primary side of transformer 45 receives the indication of the output voltage ($V_{OUT}$) of secondary winding 54. Feedback signal 42 on power bond pad 35 is obtained by passing the voltage ($V_{AUX}$) 86 on the dot end of auxiliary winding 55 through primary-side rectifier ($D_2$) 48.

As shown in FIG. 4, a feedback voltage ($V_{FB}$) on node 94 of controller IC 31 is generated by passing feedback signal 42 present on power bond pad (VDD) 35 through compensating diode 67 and voltage divider 68. The feedback voltage ($V_{FB}$) is then sampled when main power switch 60 is off and inductor switch 34 is off. When inductor switch control signal 84 is deasserted and turns off main power switch 60, a sampler switch signal 95 is asserted and closes both first switch ($SW_1$) 71 and second switch ($SW_2$) 72. Then when inductor switch control signal 84 is asserted, sampler switch signal 95 opens second switch ($SW_2$) and samples the feedback voltage ($V_{FB}$). When inductor switch control signal 84 is asserted and main power switch 60 is on, sampler switch signal 95 also opens first switch (SW$_1$) 71. First switch (SW$_1$) 71 is opened primarily in order to decrease the amount of current required in the start-up phase.

When main power switch 60 is on and first switch (SW$_1$) 71 is open, the voltage (V$_{AUX}$) 86 goes negative, as shown in FIG. 6. The voltage of feedback signal 42 present on power bond pad (VDD) 35 is prevented, however, from going negative by primary-side rectifier (D$_2$) 48. While main power switch 60 is on, controller IC 31 is powered by the charge on power capacitor (C$_1$) 50. FIG. 6 shows the charge on power capacitor (C$_1$) 50 while main power switch 60 is on as voltage (V$_{DD}$) of feedback signal 42. In an exaggerated manner for illustrative purposes, FIG. 6 shows that the voltage (V$_{DD}$) on power capacitor (C$_1$) 50 droops while main power switch 60 is on as controller IC 31 consumes power. Then, at time T$_2$ the voltage (V$_{DD}$) on power capacitor (C$_1$) 50 is refreshed when sampler switch signal 95 closes first switch (SW$_1$) 71 and second switch (SW$_2$) 72.

The sampled feedback voltage (V$_{FBS}$) is held by sampler capacitor (C$_2$) 70. The relationship between sampled feedback voltage (V$_{FBS}$) and the output voltage (V$_{OUT}$) is determined as follows. When inductor switch 34 has just been turned off and energy is transferring to secondary winding 54, the voltage (V$_{AUX}$) 86 across auxiliary winding 55 is equal to $$V_{AUX} = (V_{OUT} + V_{D1}) \cdot \frac{N_a}{N_s}. \tag{96}$$

The voltage (V$_{DD}$) of feedback signal 42 present on power bond pad (VDD) 35 equals the voltage (V$_{AUX}$) 86 minus the voltage drop (V$_{D2}$) across primary-side rectifier (D$_2$) 48. Thus, V$_{DD}$+V$_{D2}$=(V$_{OUT}$+V$_{D1}$)N$_a$/N$_s$. So the voltage of feedback signal 42 can be expressed as $$V_{DD} = \frac{N_a}{N_s} \cdot V_{out} + \left(\frac{N_a}{N_s} \cdot V_{D1} - V_{D2}\right). \tag{97}$$

The second term is an "error" term that can be minimized by choosing a primary-side rectifier (D$_2$) that has a voltage drop equal to the turns ratio N$_a$/N$_s$ times the voltage drop of secondary-side rectifier (D$_1$) 46. Alternatively, multiple primary-side rectifier diodes can be used in series to compensate for the voltage drop of secondary-side rectifier (D$_1$) 46. For example, where secondary-side rectifier (D$_1$) 46 is a Schottkey diode with a voltage drop of about 0.4 volts and the turns ratio N$_a$/N$_s$ is 3:1, two 4148-type diodes each with a voltage drop of about 0.65 volts can be used in series as the primary-side rectifiers. The "error" term would then be reduced to 0.1 volts (3·0.4V−2·0.65V).

A primary-side rectifier (D$_2$) 48 should be chosen that has a breakdown voltage greater than the sum of the maximum positive voltage (V$_{DD}$) on power bond pad (VDD) 35 and the peak negative voltage (V$_{AUX}$) 86. For example, where the peak of the input line voltage received by primary inductor 33 is about 400 volts and the turns ratio N$_p$/N$_a$ is 4:1, the peak negative voltage (V$_{AUX}$) 86 will be about −100 volts. Where the voltage drop across compensating diode 67 and voltage divider 68 has been chosen to achieve a voltage (V$_{DD}$) on power bond pad (V$_{DD}$) 35 of about fifteen volts and the maximum positive voltage (V$_{DD}$) is slightly greater than the clamp voltage, primary-side rectifier (D$_2$) 48 should be chosen to have a breakdown voltage greater than one hundred twenty volts [20V−(−100V)]. Where the under-voltage lockout turn-on threshold is nineteen volts, the clamp voltage of power voltage clamp 69 must be at least twenty volts so that a sufficient voltage level will be achieved to turn on controller IC 31.

In the embodiment of FIG. 3, compensating rectified diode (D$_3$) 67 within controller IC 31 is also used to minimize the "error" term of equation 97. The voltage (V$_{DD}$) of feedback signal 42 present on power bond pad (V$_{DD}$) 35 can also be expressed as $$V_{DD} = V_{FBS} \cdot \left(\frac{R_{FB1} + R_{FB2}}{R_{FB2}}\right) + V_{D3}, \tag{98}$$

where V$_{FBS}$ is the sampled feedback voltage on node 99 of controller IC 31. Combining equations 97 and 98 and solving for V$_{OUT}$ results in $$V_{OUT} = V_{FBS}\left(\frac{N_s}{N_a}\right)\left(\frac{R_{FB1} + R_{FB2}}{R_{FB2}}\right) + \left(\frac{N_s}{N_a}\right)\left(V_{D3} + V_{D2} - \left(\frac{N_a}{N_s}\right)V_{D1}\right). \tag{100}$$

The "error" term can now be minimized by making the combined voltage drop across both primary-side rectifier (D$_2$) 48 and compensating rectified diode (D$_3$) 67 equal to the turns ratio N$_a$/N$_s$ times the voltage drop of secondary-side rectifier (D$_1$) 46. By choosing the appropriately sized diodes 48 and 67 that eliminate the "error" term in equation 100, the output voltage (V$_{OUT}$) can be adjusted based on the sampled feedback voltage (V$_{FBS}$) according to the following relationship $$V_{OUT} = V_{FBS}\left(\frac{N_s}{N_a}\right)\left(\frac{R_{FB1} + R_{FB2}}{R_{FB2}}\right). \tag{101}$$

Reference voltage generator 62 converts the output of regulator and under-voltage lockout circuit (UVLO) 61 into a reference voltage V$_{REF}$. The reference voltage V$_{REF}$ is then summed with cord correction voltage (V$_{CORD}$) of a cord correction signal 102 generated by cord correction circuit 73. The sum of the reference voltage V$_{REF}$ and the cord correction voltage (V$_{CORD}$) is then compared to the sampled feedback voltage (V$_{FBS}$) by PWM error amplifier 63. PWM error amplifier 63 outputs an error signal 103. An internal compensation network for PWM error amplifier 63 is formed by a resistor 104 and the capacitors 105 and 106. Error comparator 64 receives error signal 103 and voltage signal 90 and outputs pulse width signal 93. PWM logic 58 receives pulse width signal 93 and uses it to adjust the pulse width of N-channel on signal 87. Thus, error comparator 64 serves as a pulse-width modulation comparator in the constant-voltage mode of flyback converter 30. When inductor current 85 is below the peak current limit in the constant voltage mode, the negative feedback loop of controller IC 31 regulates the sampled feedback voltage (V$_{FBS}$) to the sum of the reference voltage V$_{REF}$ and the cord correction voltage (V$_{CORD}$). Pulse width signal 93 output by error comparator 64 controls the pulse width of inductor switch control signal 84 such that the output voltage (V$_{OUT}$) is generated according to:

$$V_{OUT} = (V_{REF} + V_{CORD})\left(\frac{N_s}{N_a}\right)\left(\frac{R_{FB1} + R_{FB2}}{R_{FB2}}\right). \tag{107}$$

In the constant current mode, controller IC 31 also uses information from the feedback voltage ($V_{FB}$) on node 94 to adjust the frequency at which pulses of peak current ramp up through primary inductor 33. Switching frequency signal 92 output by oscillator 56 controls the frequency ($f_{OSC}$) of inductor switch control signal 84 such that the output current ($I_{OUT}$) remains constant. The output current ($I_{OUT}$) is dependent on both the switching frequency ($f_{OSC}$) and on the output voltage ($V_{OUT}$) because the output power of flyback converter 30 in discontinuous conduction mode (DCM) generally depends only on the stored energy of primary inductor 33 as follows:

$$P_{OUT} = (V_{OUT}) \cdot I_{OUT} = \tfrac{1}{2} \cdot I_P^2 \cdot L_P \cdot f_{OSC} \cdot f_{OSC} \cdot \eta \tag{108}$$

where $L_P$ is the inductance of primary winding 33, $I_P$ is the peak current through primary inductor 33, and $\eta$ is the efficiency. In constant current mode, the peak current ($I_P$) always reaches its limit and is therefore constant. Thus, the current output ($I_{OUT}$) from flyback converter 30 expressed as a function of switching frequency ($f_{OSC}$) and output voltage ($V_{OUT}$) is:

$$I_{OUT} = \frac{\tfrac{1}{2} \cdot I_P^2 \cdot L_P \cdot f_{OSC}}{V_{OUT}} \cdot \eta. \tag{109}$$

When the peak current ($I_P$) reaches its limit, then the output voltage drops ($V_{OUT}$) and flyback converter 30 enters constant current mode. Equation 109 shows that when the peak current ($I_P$) through primary inductor 33 is at its limit, the switching frequency ($f_{OSC}$) must be adjusted proportionally to the output voltage drops ($V_{OUT}$) in order to maintain a constant output current ($I_{OUT}$).

Oscillator 56 obtains information on the output voltage ($V_{OUT}$) through frequency modulator (FMOD) 65 from the feedback voltage ($V_{FB}$) when inductor switch 34 is off. As the output voltage ($V_{OUT}$) received by the device being charged increases in the constant current mode, oscillator 56 outputs switching frequency signal 92 so as to control the switching frequency ($f_{OSC}$) of inductor switch control signal 84 such that the switching frequency ($f_{OSC}$) increases proportionally the output voltage ($V_{OUT}$). Thus, in order to maintain a constant output current ($I_{OUT}$) while the output voltage ($V_{OUT}$) is increasing, controller IC 31 increases the switching frequency ($f_{OSC}$).

Cord correction circuit 73 receives filtered error signal 103 and generates cord correction signal 102 whose voltage is proportional to that of error signal 103. Cord correction signal 102 is used to adjust the voltage of the reference voltage ($V_{REF}$) to compensate for the loss of output voltage caused by the series resistance of the charger cord of flyback converter 30. Cord resistance compensation provides a reasonably accurate constant voltage at the end of the cord that connects flyback converter 30 to the device that is to be charged or powered, such as a cell phone or a portable media player. Output voltage is lost because the voltage at the point of load will have an I·R drop due to the finite series resistance of the cord multiplied by the output current of the power supply. Primary-side-controlled flyback power converter 30 relies on the reflected feedback voltage across transformer 45 from secondary winding 54 to auxiliary winding 55 to regulate the output voltage ($V_{OUT}$), but this reflected voltage does not include the I·R voltage drop error resulting from the finite cord resistance. In the constant-voltage mode of operation, the output of error amplifier 63 is proportional to the output current of flyback converter 30. Therefore, error signal 103 is used to produce cord correction signal 102 whose voltage is proportional to output current and which is applied to the reference voltage input of error amplifier 63 to compensate for cord resistance.

Figure 7:
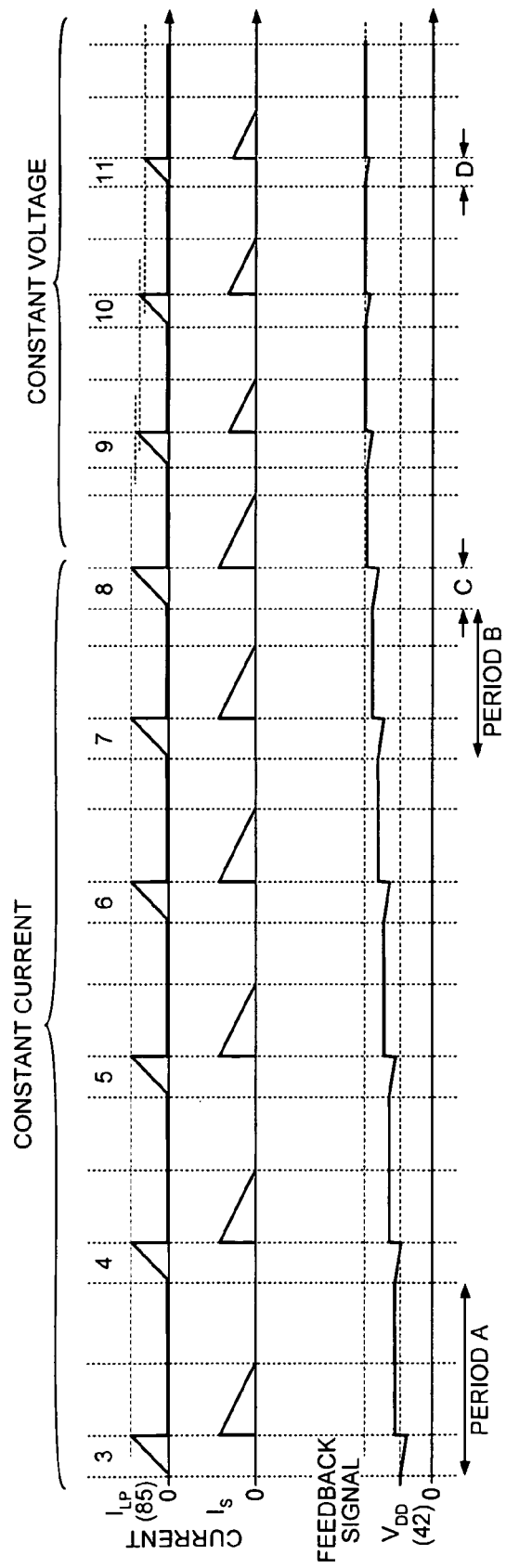
FIG. 7 is a diagram showing waveforms that illustrate how the flyback converter of FIG. 3 adjusts the switching frequency so as to maintain a constant output current and adjusts the pulse width so as to maintain a constant output voltage.

FIG. 7 is a waveform diagram showing primary inductor current ($I_{LP}$) 85, the current ($I_S$) through secondary winding 54 and feedback signal ($V_{DD}$) 42 over multiple switching periods (periods number 3-11) as a flyback converter 30 charges a device. The waveforms illustrate how flyback converter 30 adjusts the switching frequency ($f_{OSC}$) in step 82 of the method of FIG. 5 so as to maintain a constant output current ($I_{OUT}$). As flyback converter 30 charges a device and the output voltage ($V_{OUT}$) increases in the constant current mode, the switching frequency ($f_{OSC}$) is increased so that the output current ($I_{OUT}$) remains constant. FIG. 7 illustrates that the switching period A is longer at a lower voltage ($V_{DD}$) of feedback signal 42 than the switching period B at a higher voltage ($V_{DD}$) of feedback signal 42. The shorter switching period B corresponds to a higher switching frequency ($f_{OSC}$).

The waveforms of FIG. 7 also illustrate how flyback converter 30 adjusts the pulse width of inductor switch control signal 84 in step 83 of the method of FIG. 5 so as to maintain a constant output voltage ($V_{OUT}$). In the constant voltage mode, controller IC 31 controls the pulse width of inductor switch control signal 84 such that the peak of each pulse of inductor current 85 maintains a constant output voltage ($V_{OUT}$). As the device being charged approaches a fully charged condition, the output voltage ($V_{OUT}$) approaches the predetermined maximum output voltage. FIG. 7 illustrates that the pulse width D is shorter than the pulse width C in order to decrease the peak current through primary inductor 33 and thereby the output voltage ($V_{OUT}$) as the predetermined limit of voltage ($V_{DD}$) of feedback signal 42 is reached. The negative feedback loop of controller IC 31 controls the pulse width of inductor switch control signal 84 such that the sampled feedback voltage ($V_{FBS}$) equals the sum of the reference voltage $V_{REF}$ and the cord correction voltage ($V_{CORD}$).

Figure 8:
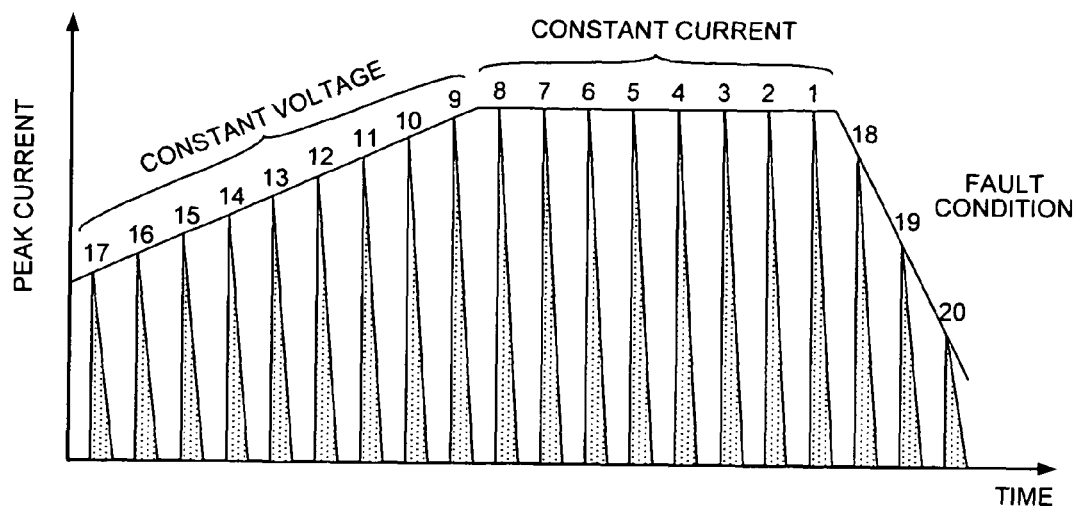
FIG. 8 is a graph of the peak current output by the flyback converter of FIG. 3 over time in a constant current mode and in a constant voltage mode.

FIG. 8 is a graph of the peak current output by flyback converter 30 over time in the constant current mode and constant voltage mode. Each peak represents the current output by flyback converter 30 during one switching period. Switching periods number 3-11 correspond to the same numbered switching periods of FIG. 7. In the example of charging a cell phone battery, the charging begins in the constant current mode at period #1 and enters the constant voltage mode at period #9. As the cell phone battery charges and the load from the cell phone battery decreases, the flyback converter 30 reduces the peak current through period #17 in order to maintain constant voltage.

Figure 9:
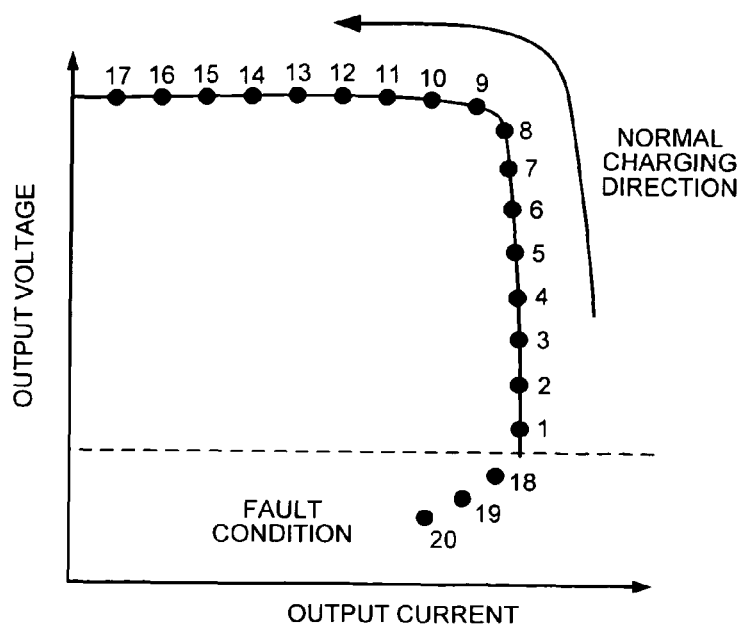
FIG. 9 is a graph of output voltage versus output current for the flyback converter of FIG. 3.

FIG. 9 is a graph of output voltage versus output current for flyback converter 30. The numbers along the curve correspond to the peak currents in the periods of FIG. 8. A normal charging process begins at point #1 and proceeds to point #17. A fault condition occurs where the output voltage falls below the fault threshold represented by the dashed line. When the output voltage falls below the fault threshold, the voltage ($V_{DD}$) present on power bond pad ($V_{DD}$) 35 drops below the under-voltage lockout turn-off threshold, and switching stops. The voltage ($V_{DD}$) present on power bond pad ($V_{DD}$) 35 is re-charged by the input voltage until $V_{DD}$ reaches the turn-on threshold, switching resumed, and flyback converter 30 re-attempts charging the battery.

Figure 10:
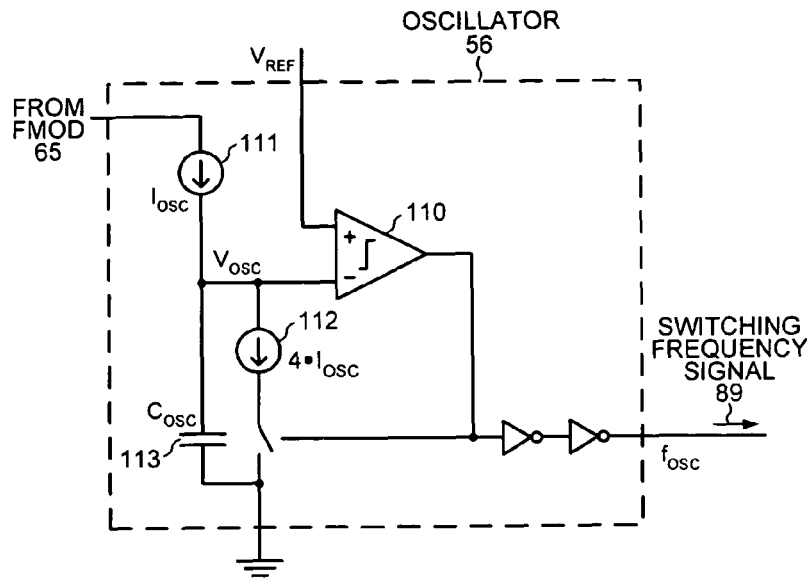
FIG. 10 is a more detailed schematic diagram of an oscillator within the controller IC of FIG. 3.
Figure 11:
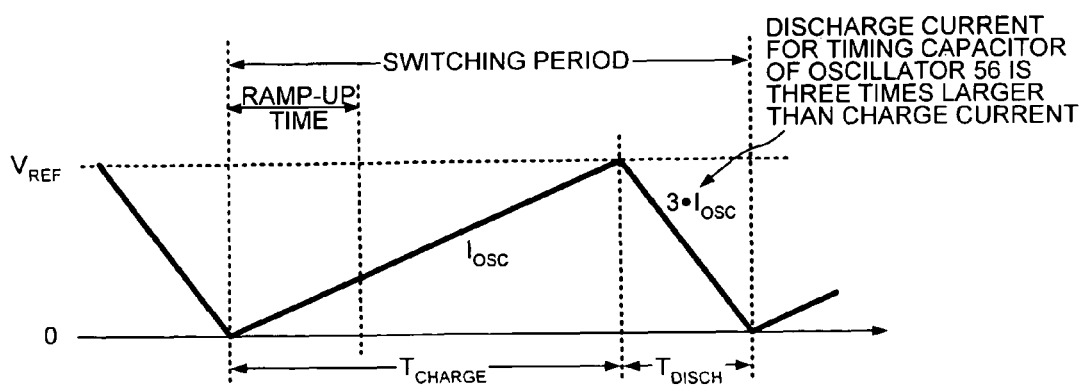
FIG. 11 is a waveform diagram showing idealized timing waveforms of the oscillator in FIG. 10.

FIG. 10 shows oscillator 56 of controller IC 31 in more detail. Oscillator 56 is powered by a five-volt power signal generated by regulator 61. Oscillator 56 includes a voltage comparator 110, two current sources 111 and 112, and an oscillator capacitor $C_{OSC}$ 113. Oscillator capacitor $C_{OSC}$ 113 is charged with a charge current $I_{OSC}$ generated by current source 111. In this embodiment, oscillator capacitor $C_{OSC}$ 113 is discharged by current source 112 at a discharge current that is four times as large as the charge current. Because charging current source 111 is not turned off when discharging current source 112 is turned on, the discharging current is three times as large as the charging current, as shown in FIG. 11. Oscillator 56 can be modeled as an internal RC oscillator that generates a frequency $f_{OSC}$ of switching frequency signal 92 that is dependent on the capacitance of oscillator capacitor $C_{OSC}$ and the oscillator resistance $R_{OSC}$. The oscillator resistance can be expressed as $R_{OSC}=V_{FB}/I_{OSC}$. FMOD 65 generates a bias current with a voltage that is proportional to the voltage of feedback signal 42 when main power switch 60 is off. Current source 111 receives this bias current and thereby adjusts the oscillator frequency ($f_{OSC}$) based on the output voltage ($V_{OUT}$) of flyback converter 30.

Figure 12:
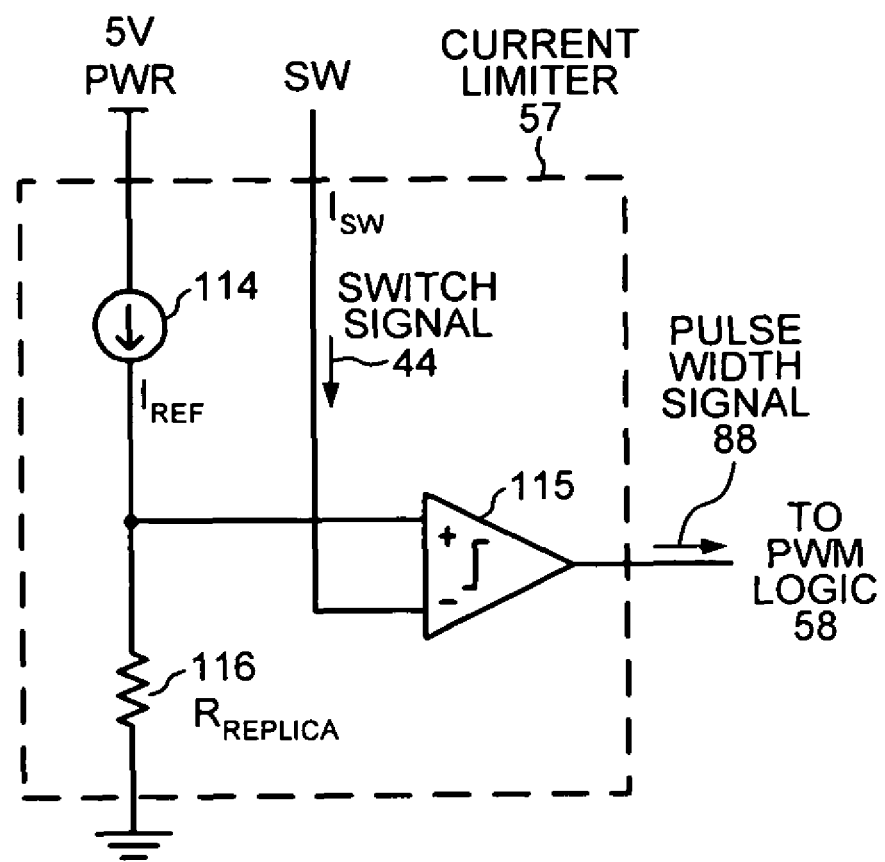
FIG. 12 is a more detailed schematic diagram of a current limiter within the controller IC of FIG. 3.

FIG. 12 shows current limiter 57 of controller IC 31 in more detail. Current limiter 57 includes a bias-current source 114, a comparator 115 and a replica resistor ($R_{REPLICA}$) 116. Replica resistor ($R_{REPLICA}$) 116 replicated the drain-source resistance ($R_{DSON}$) of main power switch 60. Bias-current source 114 uses replica resistor 116 to generate a voltage on the non-inverting input lead of comparator 115 corresponding to a reference current ($I_{REF}$). Comparator 115 then compares the voltage of switch signal ($I_{SW}$) 44 to the voltage corresponding to the reference current ($I_{REF}$) generated by bias-current source 114. The output of comparator 115 goes low when switch signal ($I_{SW}$) 44 exceeds the comparator threshold generated by $R_{REPLICA} \cdot I_{REF}$, and main power switch 60 is turned off. In constant current mode, current limiter 57 controls the switch turn-off, and in the constant voltage mode, error comparator 64 controls the switch turn-off.

Figure 13:
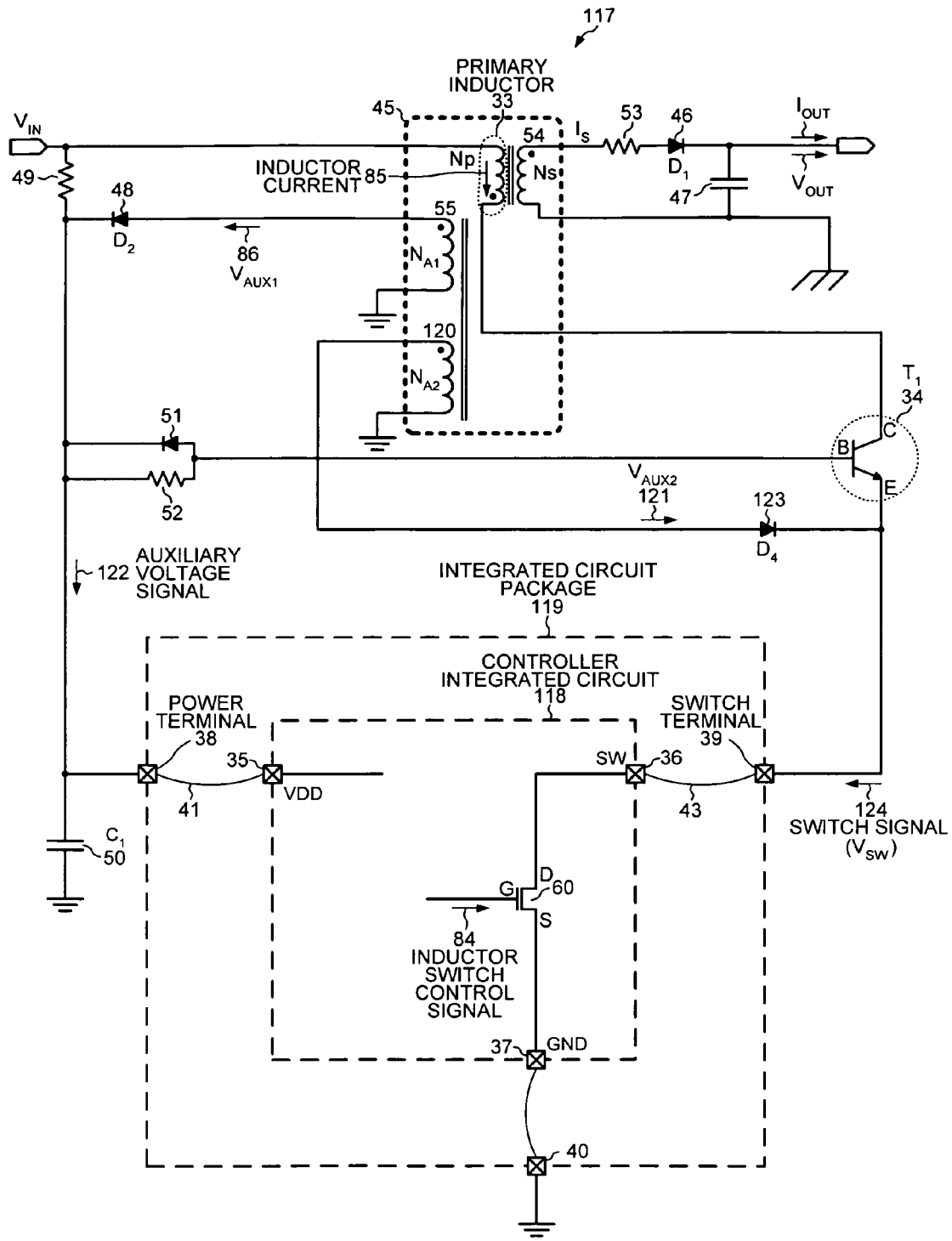
FIG. 13 is a simplified schematic diagram of a primary-side controlled flyback converter with a controller IC housed in an integrated circuit package with only three pins in accordance with a second embodiment of the invention.

FIG. 13 shows another embodiment of a flyback converter 117 with a controller integrated circuit (IC) 118 packaged in an integrated circuit package 119 having only three terminals. In the embodiment of flyback converter 30, power bond pad 35 is used both to power controller IC 31 and to receive an indication of the output voltage $V_{OUT}$. In the embodiment of flyback converter 117, however, it is switch bond pad 36 that is used for multiple purposes: both to receive an indication of the output voltage $V_{OUT}$ and to receive an indication of the inductor current 85 flowing through primary inductor 33.

Flyback converter 117 has a second auxiliary winding 120 that enables switch bond pad 36 to be used to receive an indication of the output voltage $V_{OUT}$. As inductor current 85 ramps up through primary inductor 33 and then stops flowing, energy is transferred both to first auxiliary winding 55 and to second auxiliary winding 120. A voltage ($V_{AUX1}$) 86 is generated on the dot end of first auxiliary winding 55, and a voltage ($V_{AUX2}$) 121 is generated on the dot end of second auxiliary winding 120. First auxiliary winding 55 has $N_{A1}$ turns, and second auxiliary winding 120 with $N_{A2}$ turns. In order to ensure that external NPN bipolar transistor 34 remains off when inductor switch control signal 84 is deasserted and main power switch 60 is off, the turn number $N_{A2}$ of second auxiliary winding 120 is made greater than the turn number $N_{A1}$ of first auxiliary winding 55. Making $N_{A2}$ greater than $N_{A1}$ ensures that the voltage ($V_{AUX2}$) 121 present on the emitter of inductor switch 34 when main power switch 60 is off is greater than the voltage present on the base of inductor switch 34 that is generated with the voltage ($V_{AUX1}$) 86.

An auxiliary voltage signal 122 is derived from the voltage ($V_{AUX}$) 86 across first auxiliary inductor 55 when first auxiliary inductor 55 magnetically couples with primary winding 33 and secondary winding 54. The waveform of auxiliary voltage signal 122 is substantially the same as that of feedback signal 42 of the embodiment of flyback converter 30, except that auxiliary voltage signal 122 is not used to provide feedback information to controller IC 118. The dot end of second auxiliary winding 120 is coupled through a second primary-side rectifier 123 ($D_4$) to both the emitter of inductor switch 34 and to switch terminal 39. When inductor switch 34 is on and the voltage on the dot end of second auxiliary winding 120 is negative, second primary-side rectifier 123 ($D_4$) is reverse biased and a switch signal ($V_{SW}$) 124 that is received onto switch terminal 39 corresponds to switch signal ($I_{SW}$) 44 in the embodiment of flyback converter 30. When inductor switch 34 is off, switch signal ($V_{SW}$) 124 that is received onto switch terminal 39 follows the voltage ($V_{AUX2}$) 121 generated by second auxiliary winding 120.

As in the embodiment of flyback converter 30, the auxiliary voltage signal 122 present on power bond pad (VDD) 35 equals the voltage ($V_{AUX1}$) 86 minus the voltage drop ($V_{D2}$) across primary-side rectifier ($D_2$) 48. Consequently, $V_{DD}+V_{D2}=(V_{OUT}+V_{D1})N_{A1}/N_S$, and the voltage of auxiliary voltage signal 122 provides an indication of the output voltage ($V_{OUT}$) of flyback converter 117 as follows $$V_{DD} = \frac{N_{A1}}{N_s} \cdot V_{OUT} + \left(\frac{N_{A1}}{N_s} \cdot V_{D1} - V_{D2}\right). \quad (125)$$

But although auxiliary voltage signal 122 provides an indication of the output voltage ($V_{OUT}$), auxiliary voltage signal 122 is used only to power controller IC 118 and to generate reference voltages in the embodiment of FIG. 13.

When main power switch 60 is off, inductor switch 34 is off, and after current has just finished ramping down to zero in secondary winding 54 at time $T_3$, switch signal 124 similarly provides an indication of the output voltage ($V_{OUT}$) of flyback converter 117 as follows $$V_{SW} = \frac{N_{A2}}{N_s} \cdot V_{OUT} + \left(\frac{N_{A2}}{N_s} \cdot V_{D1} - V_{D4}\right). \quad (126)$$

Figure 14:
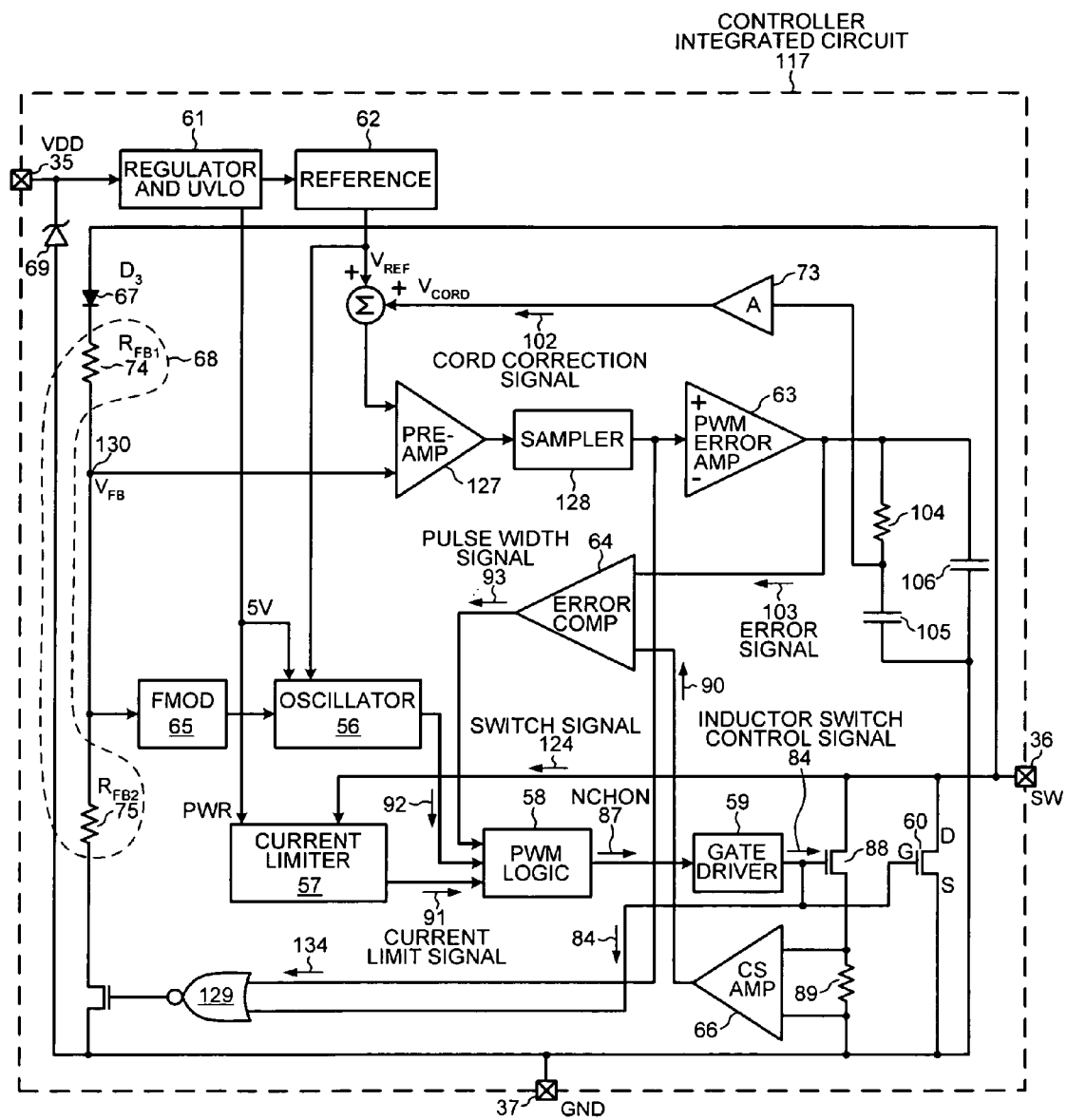
FIG. 14 is a more detailed schematic diagram of the controller IC of FIG. 13.

FIG. 14 is a more detailed schematic diagram of controller IC 118. Controller IC 118 is similar to controller IC 31 except that controller IC 118 includes a pre-amplifier 127, a feedback sampler 128 and a NOR gate 129. In addition, compensating diode 67 and voltage divider 68 are connected to switch bond pad (SW) 36 instead of to power bond pad (VDD) 35.

Compensating rectified diode ($D_3$) 67 within controller IC 118 is used to minimize the "error" term of equation 126. The voltage ($V_{SW}$) of switch signal 124 present on switch bond pad 36 can also be expressed in terms of a feedback voltage ($V_{FB}$) present on a node 130 as $$V_{SW} = V_{FB} \cdot \left(\frac{R_{FB1} + R_{FB2}}{R_{FB2}}\right) + V_{D3}. \quad (131)$$

Combining equations 126 and 131 and solving for $V_{OUT}$ results in $$V_{OUT} = V_{FB}\left(\frac{N_s}{N_{A2}}\right)\left(\frac{R_{FB1} + R_{FB2}}{R_{FB2}}\right) + \left(\frac{N_s}{N_{A2}}\right)\left(V_{D3} + V_{D4} - \left(\frac{N_{A2}}{N_s}\right)V_{D1}\right). \quad (132)$$

The "error" term can be minimized by making the combined voltage drop across both second primary-side rectifier 123 ($D_4$) and compensating rectified diode ($D_3$) 67 equal to the turns ratio $N_{A2}/N_s$ times the voltage drop of secondary-side rectifier ($D_1$) 46. By choosing the appropriately sized diodes 123 and 67 that eliminate the "error" term in equation 132, the output voltage ($V_{OUT}$) can be adjusted based on the feedback voltage ($V_{FB}$) on node 130 according to the following relationship $$V_{OUT} = V_{FB}\left(\frac{N_s}{N_{A2}}\right)\left(\frac{R_{FB1} + R_{FB2}}{R_{FB2}}\right). \quad (133)$$

Unlike the embodiment of flyback converter 30, however, the "error" term is not uniformly minimized at all times when the feedback voltage ($V_{FB}$) could be sampled while inductor switch 34 is off. In the embodiment of flyback converter 117, current is flowing through compensating diode 67 and voltage divider 68 while inductor switch 34 is off because switch bond pad 36 is coupled to second auxiliary winding 120. The voltage drop across compensating rectified diode ($D_3$) 67 is current dependent. In contrast, in the embodiment of flyback converter 30, sampled feedback voltage ($V_{FBS}$) is sampled at time $T_4$ before current begins to flow through auxiliary winding 55. Thus, in the embodiment of flyback converter 117, the feedback voltage ($V_{FB}$) is sampled at time $T_3$ as current stops flowing through second auxiliary winding 120 and immediately prior to the "free ringing" of the voltage ($V_{AUX2}$) 121.

Feedback sampler 128 detects when the voltage ($V_{AUX2}$) 121 begins to ring as current stops flowing through second auxiliary winding 120. The output of feedback sampler 128 is used as a control signal 134 to disconnect compensating diode 67 and voltage divider 68 from switch bond pad (SW) 36 at time $T_3$ when voltage ($V_{AUX2}$) 121 begins to ring because there is a potential that voltage ($V_{AUX2}$) 121 minus the voltage drop across second primary-side rectifier 123 ($D_4$) could fall below the voltage on the base of inductor switch 34 and turn on switch 34. When control signal 134 is asserted, the voltage of switch signal ($V_{SW}$) 124 rises to near the auxiliary voltage signal ($V_{DD}$) 122 present on power bond pad (VDD) 35.

When an insignificant amount of current is flowing through compensating diode 67, and appropriately sized diodes 123 and 67 have been chosen to eliminate the "error" term in equation 132, then the feedback voltage ($V_{FB}$) on node 130 provides an indication of the output voltage ($V_{OUT}$) according to equation 133. The feedback voltage ($V_{FB}$) on node 130 is compared to the sum of the reference voltage $V_{REF}$ and the cord correction voltage ($V_{CORD}$) to produce an error signal, which is amplified by pre-amplifier 127, sampled by feedback sampler 128, and fed to PWM error amplifier 63. In a manner similar to flyback converter 30, the negative feedback loop of controller IC 117 regulates the feedback voltage ($V_{FB}$) on node 130 to the sum of the reference voltage $V_{REF}$ and the cord correction voltage ($V_{CORD}$). In the constant voltage mode, the feedback voltage ($V_{FB}$) on node 130 is regulated by adjusting the pulse width of inductor switch control signal 84 such that the output voltage ($V_{OUT}$) remains constant.

In a manner similar to flyback converter 30, the output current is also regulated. As indicated by equation 109 above, the current output ($I_{OUT}$) from flyback converter 117 is proportional to the switching frequency ($f_{OSC}$) and inversely proportional to the output voltage ($V_{OUT}$). In the constant current mode while a device is being charged and the output voltage ($V_{OUT}$) is increasing, controller IC 118 increases the switching frequency ($f_{OSC}$) at the same rate that $V_{OUT}$ increases in order to maintain a constant output current ($I_{OUT}$). To adjust the switching frequency ($f_{OSC}$), oscillator 56 obtains information on the output voltage ($V_{OUT}$) through frequency modulator (FMOD) 65 from the feedback voltage ($V_{FB}$) on node 130 at time $T_3$.

Flyback converter 117 also adjusts peak current in a manner similar to that used by flyback converter 30. Current limiter 57 of controller IC 118 receives switch signal ($V_{SW}$) 124 from switch bond pad 36 indicating the magnitude of inductor current 85 flowing through primary inductor 33. When the current of switch signal ($I_{SW}$) 44 exceeds the predetermined peak current limit, comparator 115 of current limiter 57 trips and turns off main power switch 60.

Figure 15:
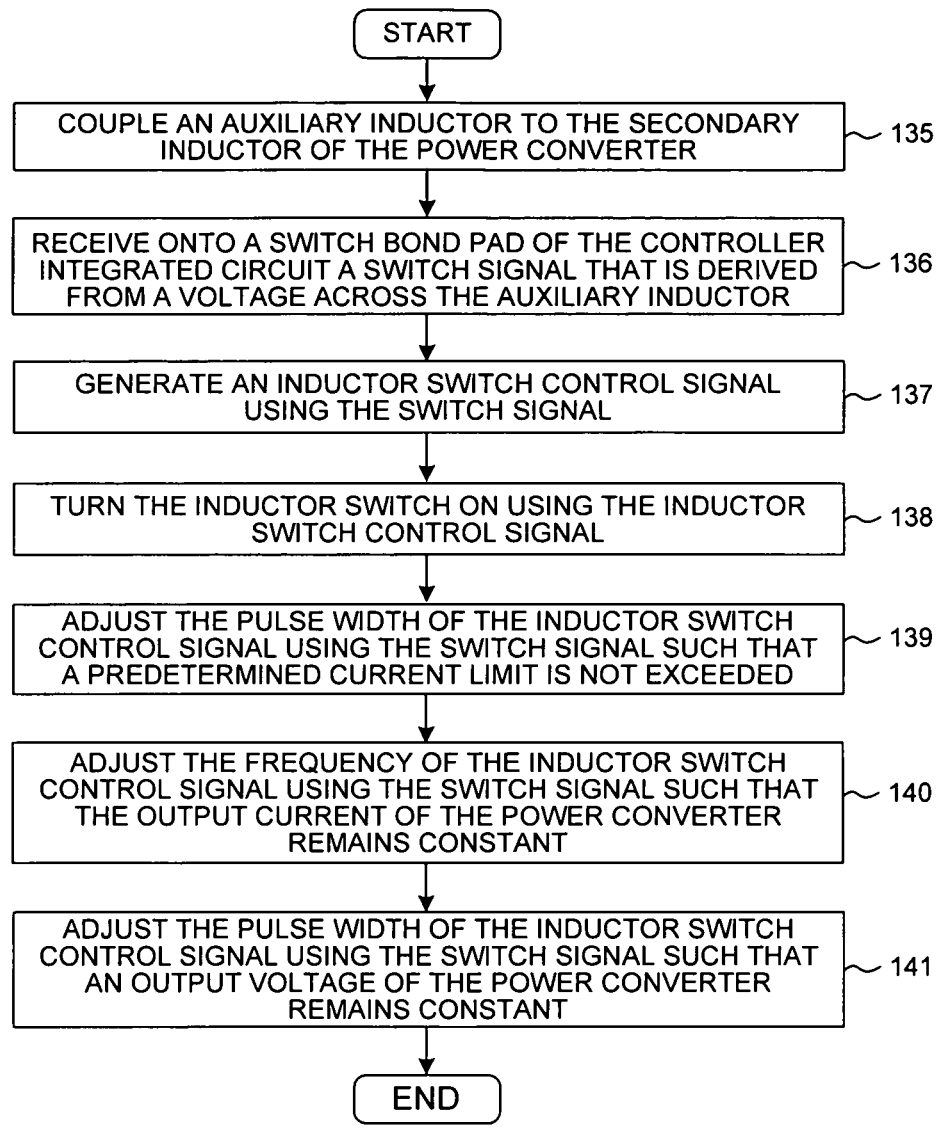
FIG. 15 is a flowchart of a method for controlling the output current and voltage of the flyback converter of FIG. 13.

FIG. 15 is a flowchart illustrating steps 135-141 of a method of operation of the flyback converter 117 of FIG. 13.

In a step 135, second auxiliary inductor 120 is coupled to secondary inductor 54 flyback converter 117.

In a step 136, switch signal ($V_{SW}$) 124 is derived from the voltage ($V_{AUX2}$) 121 across second auxiliary winding 120 and is received onto switch bond pad 36.

In a step 137, controller IC 118 generates inductor switch control signal 84 using switch signal ($V_{SW}$) 124.

In a step 138, main power switch 60 is turned on and off using inductor switch control signal 84.

In a step 139, controller IC 118 uses switch signal ($V_{SW}$) 124 to adjust the pulse width of inductor switch control signal 84 such that a predetermined current limit of the output current ($I_{OUT}$) of flyback converter 117 is not exceeded. The predetermined current limit is defined according to the requirements of the device being charged.

In a step 140, controller IC 118 uses switch signal ($V_{SW}$) 124 to adjust the frequency ($f_{OSC}$) of inductor switch control signal 84 such that the output current (Ion) of flyback converter 117 remains constant in the constant current mode.

In a step 141, controller IC 118 uses switch signal ($V_{SW}$) 124 to adjust the pulse width of inductor switch control signal 84 such that the output voltage ($V_{OUT}$) of flyback converter 117 remains constant in the constant voltage mode.

Figure 16:
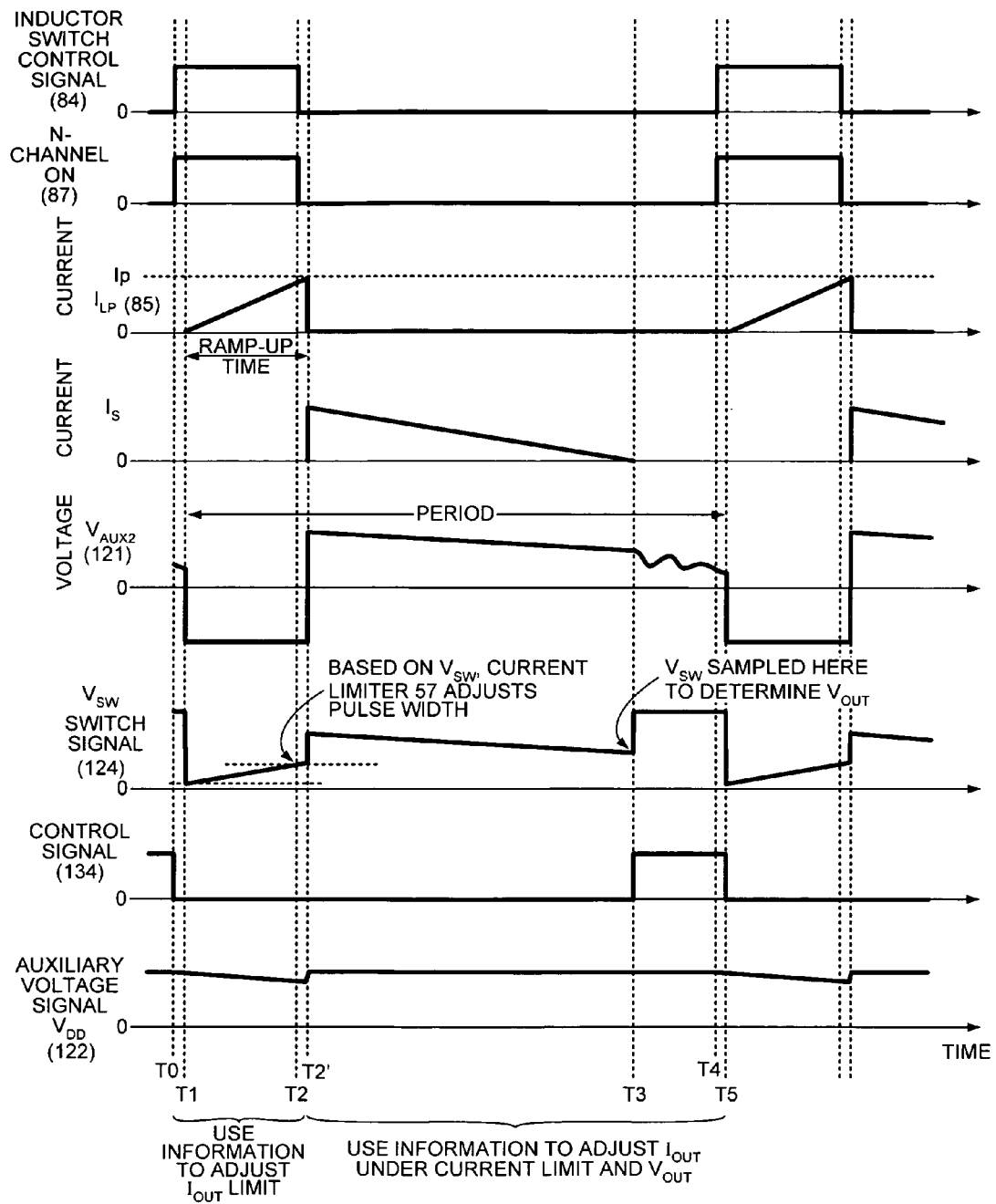
FIG. 16 is a diagram showing idealized waveforms that illustrate the operation of the flyback converter of FIG. 13 while performing the method of FIG. 15.

FIG. 16 shows idealized waveforms on various nodes of flyback converter 117. The waveforms illustrate the operation of flyback converter 117 during the method of FIG. 15. Main power switch 60 turns on at $T_0$, turns off at $T_2$, and turns on again at $T_4$. The time between $T_0$ and $T_1$ represents the delay from when main power switch 60 is turned on and when inductor switch 34 turns on allowing inductor current 85 ($I_{LP}$) to begin to ramp up. The time between $T_1$ and $T_2'$ is the ramp-up time. The time between $T_2'$ and $T_4$ is the time during which main power switch 60 is turned off. FIG. 16, illustrates that the information received from switch signal ($V_{SW}$) 124 while main power switch 60 is turned off is used to regulate both the output current (Ion) and the output voltage ($V_{OUT}$). Current limiter 57 controls the pulse width of inductor switch control signal 84 such that the time $T_2$ at which inductor current 85 stops increasing through primary inductor 33 corresponds to the time at which switch signal ($V_{SW}$) 124 reaches the preset peak current limit.

The current waveform $I_S$ shows that the current through secondary winding 54 discharges to zero by the time $T_3$. At time $T_3$ at which current $I_S$ stops flowing through secondary winding 54, switch signal ($V_{SW}$) 124 provides an indication of the output voltage ($V_{OUT}$) of secondary winding 54. The indication of the output voltage ($V_{OUT}$) is used to regulate both the output current ($I_{OUT}$) when the load demands an output current that is above the constant current limit and the output voltage ($V_{OUT}$) when the output current is below the constant current limit.

Figure 17:
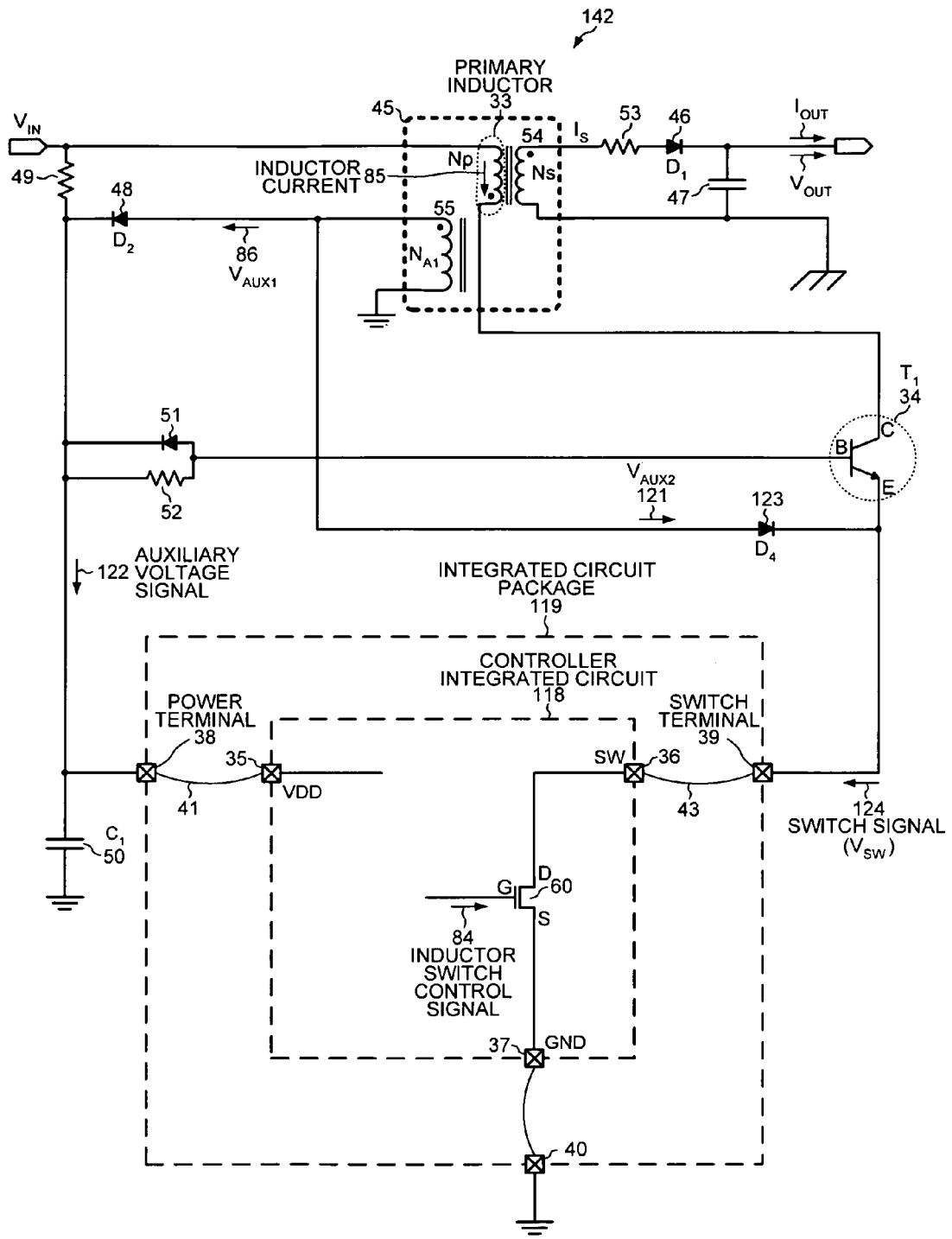
FIG. 17 is a simplified schematic diagram of a flyback converter with a controller IC in a 3-pin package similar to the embodiment of FIG. 13, except with no second auxiliary inductor.

FIG. 17 shows yet another embodiment of a flyback converter 142 with controller integrated circuit (IC) 118 packaged in an integrated circuit package 119 having only three terminals. Flyback converter 142 has only two three inductors and no second auxiliary inductor. The embodiment of FIG. 17 is similar to the embodiment of FIG. 13 except that switch terminal 39 is coupled through second primary-side rectifier 123 ($D_4$) to first auxiliary winding 55 instead of to a second auxiliary winding. In the embodiment of FIG. 17, the voltage ($V_{AUX2}$) 121 present on the emitter of inductor switch 34 is equivalent to the voltage ($V_{AUX}$) 86 across first auxiliary inductor 55.

Although the present invention has been described in connection with certain specific embodiments for instructional purposes, the present invention is not limited thereto. Although pulse-width-modulation (PWM) logic 45 is described above as employing pulse width modulation in the generation of NCHON signal 87 and inductor switch control signal 84, variable frequency modulation can be used as an alternative to fixed frequency PWM. In alternative embodiments, variable-frequency pulse frequency modulation (PFM) is used to generate NCHON signal 87 and inductor switch control signal 84. Accordingly, various modifications, adaptations, and combinations of various features of the described embodiments can be practiced without departing from the scope of the invention as set forth in the claims.

What is claimed is:

1. An integrated circuit package, comprising:
a switch terminal that is coupled to an inductor switch and to a first inductor of a flyback converter, wherein the inductor switch is turned on by an inductor switch control signal that has a frequency and a pulse width, wherein a controller integrated circuit contained in the integrated circuit package adjusts the frequency such that an output current of the flyback converter remains constant, and wherein the controller integrated circuit adjusts the pulse width such that an output voltage of the flyback converter remains constant;
a power terminal through which the controller integrated circuit receives power; and
a ground terminal through which the controller integrated circuit is grounded, wherein the integrated circuit package includes no terminals other than the switch terminal, the power terminal and the ground terminal.

2. The integrated circuit package of claim 1, wherein a switch signal is received on the switch terminal, and wherein the switch signal is indicative of a rate at which current flows through a second inductor of the flyback converter.

3. The integrated circuit package of claim 2, wherein the first inductor is an auxiliary inductor of the flyback converter, and wherein the second inductor is a primary inductor of the flyback converter.

4. An integrated circuit package, comprising:
a switch terminal that is coupled to an inductor switch, wherein the inductor switch is turned on by an inductor switch control signal that has a frequency, and wherein a controller integrated circuit contained in the integrated circuit package adjusts the frequency such that an output current of a flyback converter remains constant;
a power terminal that receives a feedback signal, wherein the feedback signal is derived from a voltage across a first inductor of the flyback converter, wherein the feedback signal provides power to the controller integrated circuit, and wherein the feedback signal is used by the controller integrated circuit to generate the inductor switch control signal; and
a ground terminal through which the controller integrated circuit is grounded, wherein the integrated circuit package includes no terminals other than the switch terminal, the power terminal and the ground terminal.

5. The integrated circuit package of claim 4, wherein a switch signal is received on the switch terminal, and wherein the switch signal is indicative of a rate at which current flows through a second inductor of the flyback converter.

6. The integrated circuit package of claim 5, wherein the first inductor is an auxiliary inductor of the flyback converter, and wherein the second inductor is a primary inductor of the flyback converter.

7. The integrated circuit package of claim 4, wherein the switch terminal is taken from the group consisting of: a pin of a transistor outline (TO) package and a pin of a small outline transistor (SOT) package.

8. The integrated circuit package of claim 5, wherein an inductor current flowing through the second inductor reaches a peak current, and wherein the controller integrated circuit controls the peak current such that the output current of the flyback converter does not exceed a predetermined current limit.

9. The integrated circuit package of claim 5, wherein an inductor current flowing through the second inductor reaches a peak current, wherein the inductor switch control signal has a pulse width, and wherein the controller integrated circuit adjusts the pulse width to control the peak current such that an output voltage of the flyback converter remains constant.

10. A power converter, comprising:
a primary inductor;
an auxiliary inductor that is magnetically coupled to the primary inductor; and
a controller integrated circuit having an inductor switch, a power bond pad, a switch bond pad and a ground bond pad, wherein the inductor switch is coupled to the switch bond pad and is turned on by an inductor switch control signal that has a frequency, wherein the controller integrated circuit receives power through the power bond pad, wherein the power bond pad receives a feedback signal that is used by the controller integrated circuit to generate the inductor switch control signal, and wherein the controller integrated circuit adjusts the frequency of the inductor switch control signal in a constant current mode such that an output current of the power converter remains constant.

11. The power converter of claim 10, wherein the controller integrated circuit has no bond pads other than the power bond pad, the switch bond pad and the ground bond pad.

12. The power converter of claim 10, wherein the feedback signal is derived from a voltage across the auxiliary inductor, and wherein the controller integrated circuit adjusts the frequency of the inductor switch control signal in the constant current mode using the feedback signal when the inductor switch is turned off.

13. The power converter of claim 10, wherein the inductor switch control signal has a pulse width, wherein the feedback signal is derived from a voltage across the auxiliary inductor, and wherein the controller integrated circuit uses the feedback signal when the inductor switch is turned off to adjust the pulse width such that an output voltage of the flyback converter remains constant.

14. A power converter, comprising:
a primary inductor;
an auxiliary inductor that is magnetically coupled to the primary inductor; and
a controller integrated circuit having an inductor switch and a power bond pad, wherein the inductor switch is turned on by an inductor switch control signal that has a frequency and a pulse width, wherein the power bond pad receives a feedback signal that is used both to power the controller integrated circuit and to generate the inductor switch control signal, wherein the feedback signal is derived from a voltage across the auxiliary inductor, wherein the controller integrated circuit uses the feedback signal when the inductor switch is turned off to adjust the frequency such that an output current of the power converter remains constant, and wherein the controller integrated circuit uses the feedback signal when the inductor switch is turned off to adjust the pulse width such that an output voltage of the flyback converter remains constant.

15. The power converter of claim 14, wherein the controller integrated circuit has a switch bond pad that is coupled to the inductor switch, wherein the controller integrated circuit is packaged in an integrated circuit package that includes a switch terminal, a power terminal and a ground terminal, wherein the switch terminal is coupled to the switch bond pad, wherein the power terminal is coupled to the power bond pad, and wherein the integrated circuit package includes no terminals other than the switch terminal, the power terminal and the ground terminal.

16. A method comprising:
magnetically coupling an auxiliary inductor to a secondary inductor of a power converter, wherein the power converter has a controller integrated circuit, and wherein the controller integrated circuit has an inductor switch;
receiving a feedback signal onto a power bond pad of the controller integrated circuit, wherein the feedback signal is derived from a voltage across the auxiliary inductor;
powering the controller integrated circuit using the feedback signal;
generating an inductor switch control signal using the feedback signal, wherein the inductor switch control signal has a frequency;
turning on the inductor switch using the inductor switch control signal; and
adjusting the frequency of the inductor switch control signal using the feedback signal such that an output current of the power converter remains constant.

17. The method of claim 16, wherein the inductor switch control signal has a pulse width, further comprising:
adjusting the pulse width of the inductor switch control signal using the feedback signal such that an output voltage of the power converter remains constant.

18. The method of claim 16, wherein information conveyed in the feedback signal while the inductor switch is turned off is used to adjust the frequency of the inductor switch control signal such that the output current of the power converter remains constant.

19. The method of claim 16, wherein the controller integrated circuit is contained in an integrated circuit package, wherein the integrated circuit package has a power terminal, a switch terminal and a ground terminal, wherein the controller integrated circuit has a switch bond pad and ground bond pad, wherein the power terminal is coupled to the power bond pad, the switch terminal is coupled to the switch bond pad and the ground terminal is coupled to the ground bond pad, and wherein the integrated circuit package includes no terminals other than the power terminal, the ground terminal and the switch terminal.

20. A power converter, comprising:
a primary inductor;
an auxiliary inductor that is magnetically coupled to the primary inductor;
a switch bond pad of a controller integrated circuit, wherein the switch bond pad is coupled to an inductor switch of the controller integrated circuit, wherein the inductor switch is turned on by an inductor switch control signal that has a frequency and a pulse width; and
means for receiving a feedback signal that is used both to power the controller integrated circuit and to generate the inductor switch control signal, wherein the feedback signal is derived from a voltage across the auxiliary inductor, wherein the feedback signal is used to adjust the frequency such that an output current of the power converter remains constant, and wherein the feedback signal is used to adjust the pulse width such that an output voltage of the flyback converter remains constant.

21. The power converter of claim 20, further comprising:
a ground bond pad of the controller integrated circuit, wherein no current is conveyed to or from the controller integrated circuit except through the switch bond pad, the ground bond pad and the means.

22. The power converter of claim 20, wherein the controller integrated circuit is packaged in an integrated circuit package that includes a switch terminal, a power terminal and a ground terminal, wherein the switch bond pad is coupled to the switch terminal, wherein the means is coupled to the power terminal, and wherein the integrated circuit package includes no more than three terminals.

* * * * *